United States Patent
Chainer et al.

(10) Patent No.: US 9,326,429 B2
(45) Date of Patent: *Apr. 26, 2016

(54) ACTIVELY CONTROLLING COOLANT-COOLED COLD PLATE CONFIGURATION

(75) Inventors: Timothy J. Chainer, Putnam Valley, NY (US); Pritish R. Parida, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 829 days.

This patent is subject to a terminal disclaimer.

(21) Appl. No.: 13/604,850

(22) Filed: Sep. 6, 2012

(65) Prior Publication Data

US 2014/0048243 A1 Feb. 20, 2014

Related U.S. Application Data

(63) Continuation of application No. 13/587,131, filed on Aug. 16, 2012, now Pat. No. 9,095,078.

(51) Int. Cl.
*F28F 27/00* (2006.01)
*H05K 7/20* (2006.01)

(52) U.S. Cl.
CPC ........ *H05K 7/20772* (2013.01); *H05K 7/20836* (2013.01)

(58) Field of Classification Search
CPC ................ H05K 7/20772; H05K 7/20836
USPC ...................... 700/276.3; 361/695, 699, 702; 165/80.4, 288
See application file for complete search history.

(56) References Cited

U.S. PATENT DOCUMENTS

| | | | |
|---|---|---|---|
| 6,111,749 | A | 8/2000 | Lamb et al. |
| 6,988,534 | B2 | 1/2006 | Kenny et al. |

(Continued)

FOREIGN PATENT DOCUMENTS

| | | |
|---|---|---|
| EP | 1 276 362 A2 | 1/2003 |
| FR | 2 640 404 A1 | 6/1990 |
| WO | WO 20061/100690 A2 | 9/2006 |

OTHER PUBLICATIONS

Chainer et al., Office Action for U.S. Appl. No. 13/587,131, filed Aug. 16, 2012 (U.S. Patent Publication No. 20140049918 A1), dated Dec. 16, 2014 (9 pages).

(Continued)

*Primary Examiner* — Charles Kasenge
(74) *Attorney, Agent, or Firm* — Daniel P. Morris, Esq.; Kevin P. Radigan, Esq.; Heslin Rothenberg Farley & Mesiti P.C.

(57) ABSTRACT

Cooling apparatuses are provided to facilitate active control of thermal and fluid dynamic performance of a coolant-cooled cold plate. The cooling apparatus includes the cold plate and a controller. The cold plate couples to one or more electronic components to be cooled, and includes an adjustable physical configuration. The controller dynamically varies the adjustable physical configuration of the cold plate based on a monitored variable associated with the cold plate or the electronic component(s) being cooled by the cold plate. By dynamically varying the physical configuration, the thermal and fluid dynamic performance of the cold plate are adjusted to, for example, optimally cool the electronic component(s), and at the same time, reduce cooling power consumption used in cooling the electronic component(s). The physical configuration can be adjusted by providing one or more adjustable plates within the cold plate, the positioning of which may be adjusted based on the monitored variable.

19 Claims, 20 Drawing Sheets

(56) References Cited

U.S. PATENT DOCUMENTS

| | | |
|---|---|---|
| 7,298,618 B2 | 11/2007 | Campbell et al. |
| 7,400,504 B2 | 7/2008 | Campbell et al. |
| 7,515,418 B2 | 4/2009 | Straznicky et al. |
| 7,830,664 B2 | 11/2010 | Campbell et al. |
| 7,869,714 B2 | 1/2011 | Patel et al. |
| 8,363,402 B2 | 1/2013 | Brunschwiler et al. |
| 8,363,413 B2 | 1/2013 | Paquette et al. |
| 2005/0264997 A1 | 12/2005 | Prasher et al. |
| 2006/0160253 A1* | 7/2006 | Kim ................ H01L 21/67109 438/5 |
| 2007/0070605 A1 | 3/2007 | Straznicky et al. |
| 2007/0091570 A1 | 4/2007 | Campbell et al. |
| 2008/0026509 A1 | 1/2008 | Campbell et al. |
| 2008/0044259 A1* | 2/2008 | Kurita ............... H01L 21/67196 414/220 |
| 2008/0245506 A1 | 10/2008 | Campbell et al. |
| 2009/0041466 A1 | 2/2009 | Patel et al. |
| 2009/0242545 A1* | 10/2009 | Matsumoto ............ G01K 1/026 219/444.1 |
| 2010/0310342 A1* | 12/2010 | Yang ................ H01L 21/67109 414/222.01 |
| 2011/0056675 A1 | 3/2011 | Barringer et al. |
| 2011/0176273 A1 | 7/2011 | Olsen et al. |
| 2011/0186415 A1* | 8/2011 | Thompson ................ C10B 7/14 201/3 |
| 2014/0049918 A1* | 2/2014 | Chainer et al. ................ 361/702 |

OTHER PUBLICATIONS

Chainer et al., Notice of Allowance for U.S. Appl. No. 13/587,131, filed Aug. 16, 2012 (U.S. Patent Publication No. 20140049918 A1), dated Mar. 19, 2015 (9 pages).

Tong, X.C., "Liquid Cooling Devices and their Materials Selection", Advanced Materials for Thermal Management of Electronic Packaging, Springer Series in Advanced Microelectronics 30, pp. 421-475 (2011).

Chainer et al., "Actively Controlling Coolant-Cooled Cold Plate Configuration", U.S. Appl. No. 13/587,131, filed Aug. 16, 2012.

* cited by examiner

ACTIVELY CONTROLLING COOLANT-COOLED COLD PLATE CONFIGURATION

CROSS-REFERENCE TO RELATED APPLICATION

This application is a continuation of U.S. patent application Ser. No. 13/587,131, filed Aug. 16, 2012, and entitled "Actively Controlling Coolant-Cooled Cold Plate Configuration," and which is assigned to the same assignee as this application, and which is hereby incorporated herein by reference in its entirety.

STATEMENT REGARDING FEDERALLY SPONSORED RESEARCH

This invention was made with Government support under Contract No. DE-EE0002894, awarded by the Department of Energy (DOE). Accordingly, the U.S. Government has certain rights in the invention.

BACKGROUND

The power dissipation of integrated circuit chips, and the modules containing the chips, continues to increase in order to achieve increases in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through the provision of a cooling apparatus comprising: a coolant-cooled cold plate and a controller. The coolant-cooled cold plate is configured to couple to one or more electronic components to be cooled, and includes an adjustable physical configuration. The controller is configured to dynamically vary the adjustable physical configuration of the coolant-cooled cold plate based on a monitored variable associated with at least one of the coolant-cooled cold plate or the electronic component(s) to be cooled by the coolant-cooled cold plate, wherein the dynamically varying of the physical configuration alters at least one of thermal or fluid dynamic performance of the coolant-cooled cold plate cooling the electronic component.

In another aspect, a computer program product is presented which includes a computer-readable storage medium comprising computer program code embodied therewith. The computer program code is executable by a processing circuit to perform a method which includes: monitoring a variable associated with at least one of a coolant-cooled cold plate or an electronic component being cooled by the coolant-cooled cold plate; and initiating dynamic varying, based on the monitored variable, of a physical configuration of the coolant-cooled cold plate. The dynamically varying of the physical configuration alters at least one of the thermal or fluid dynamic performance of the coolant-cooled cold plate cooling the electronic component.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
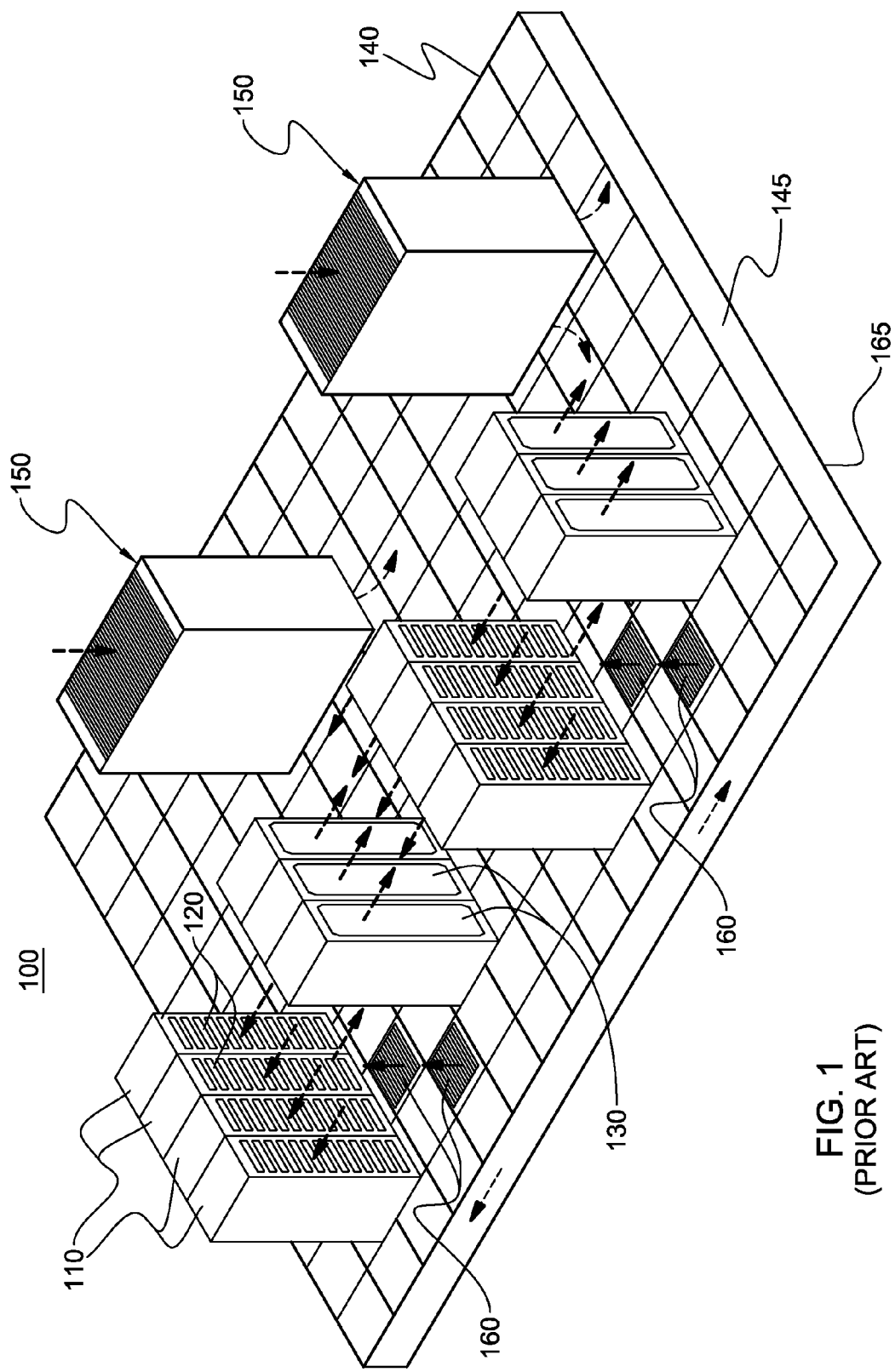
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "coolant-cooled cold plate", "coolant-cooled cold rail", or "coolant-cooled structure" refer to a thermally conductive structure having a one or more channels or passageways formed therein for flowing of coolant therethrough. In one example, the coolant is a liquid coolant.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale for ease of understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
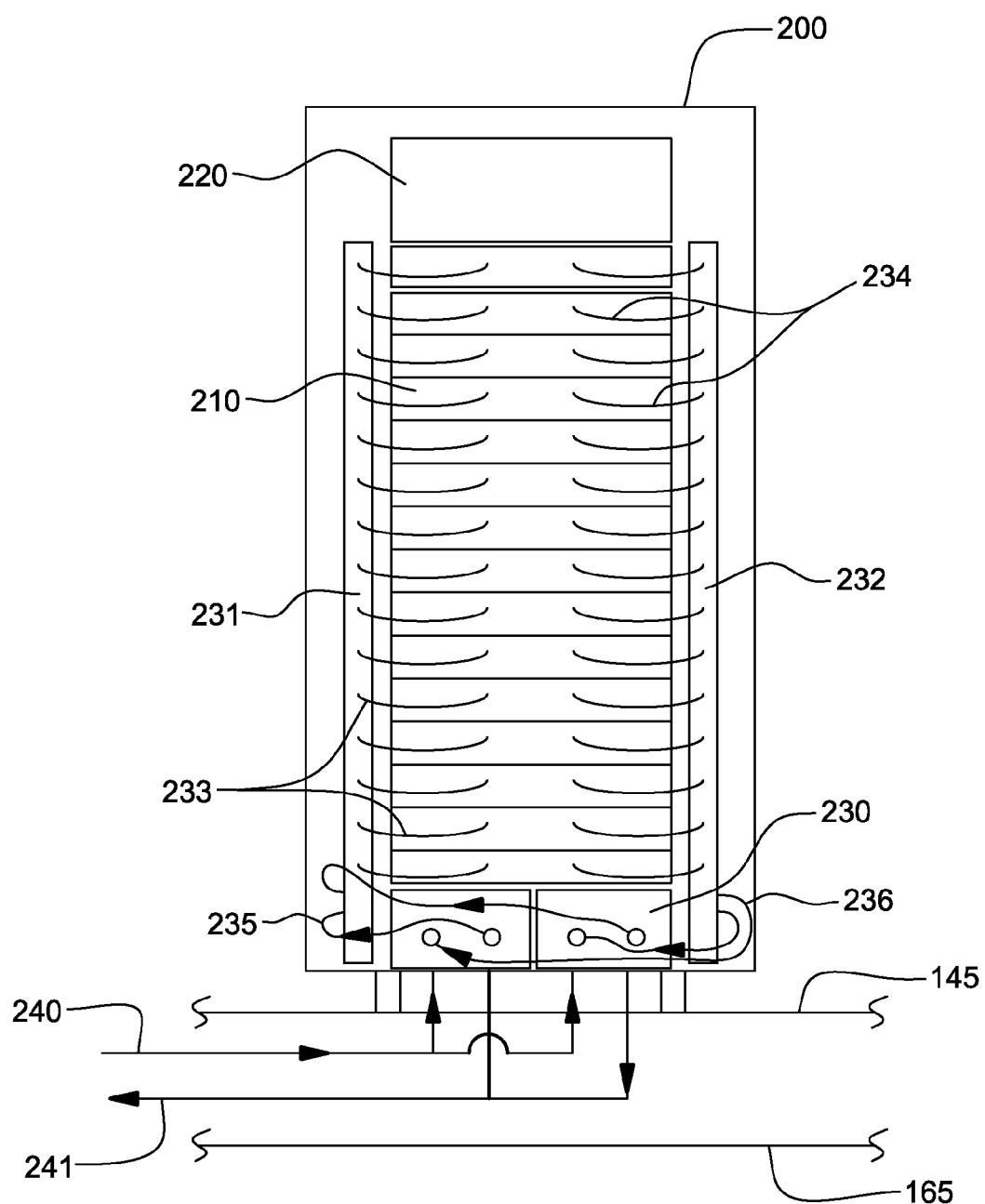
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-9B) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
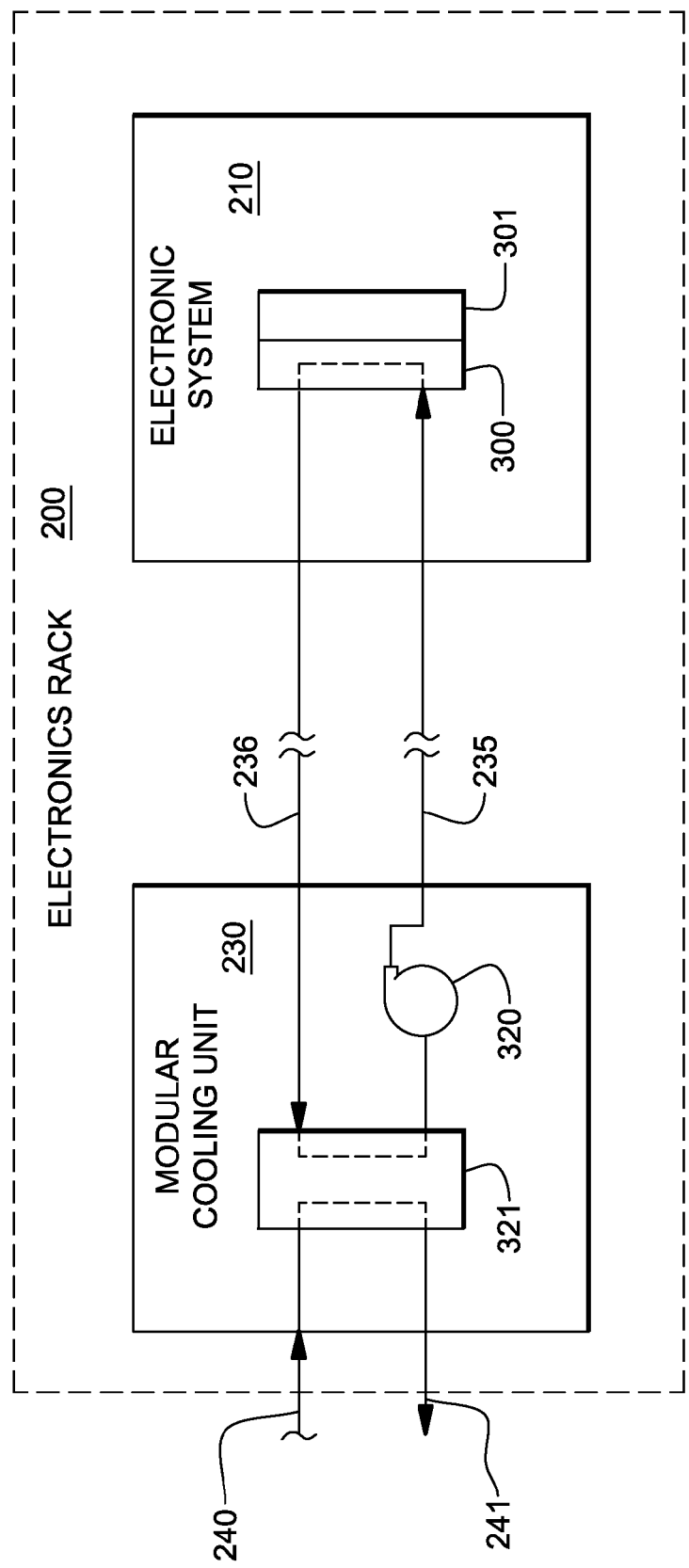
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
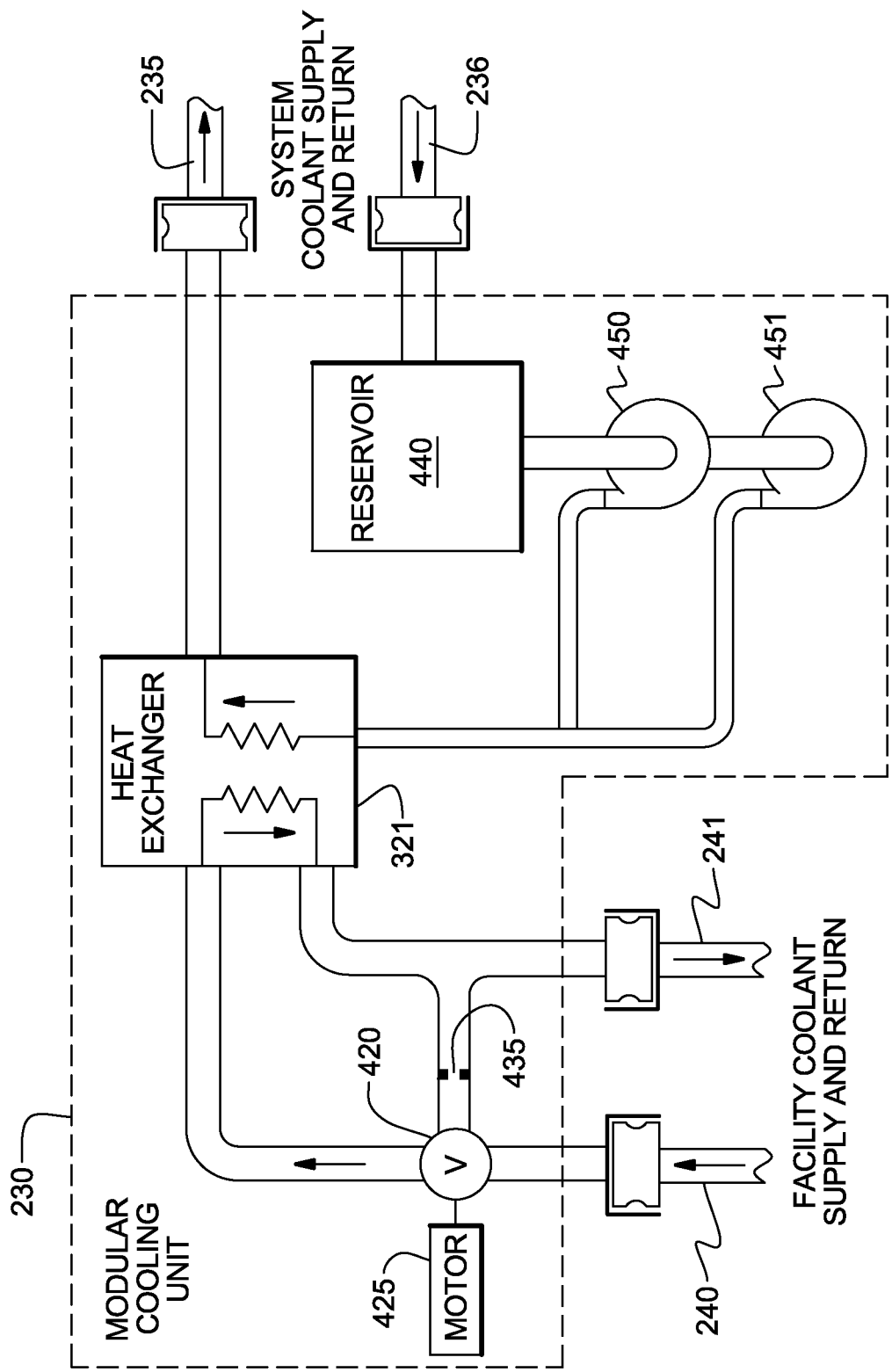
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
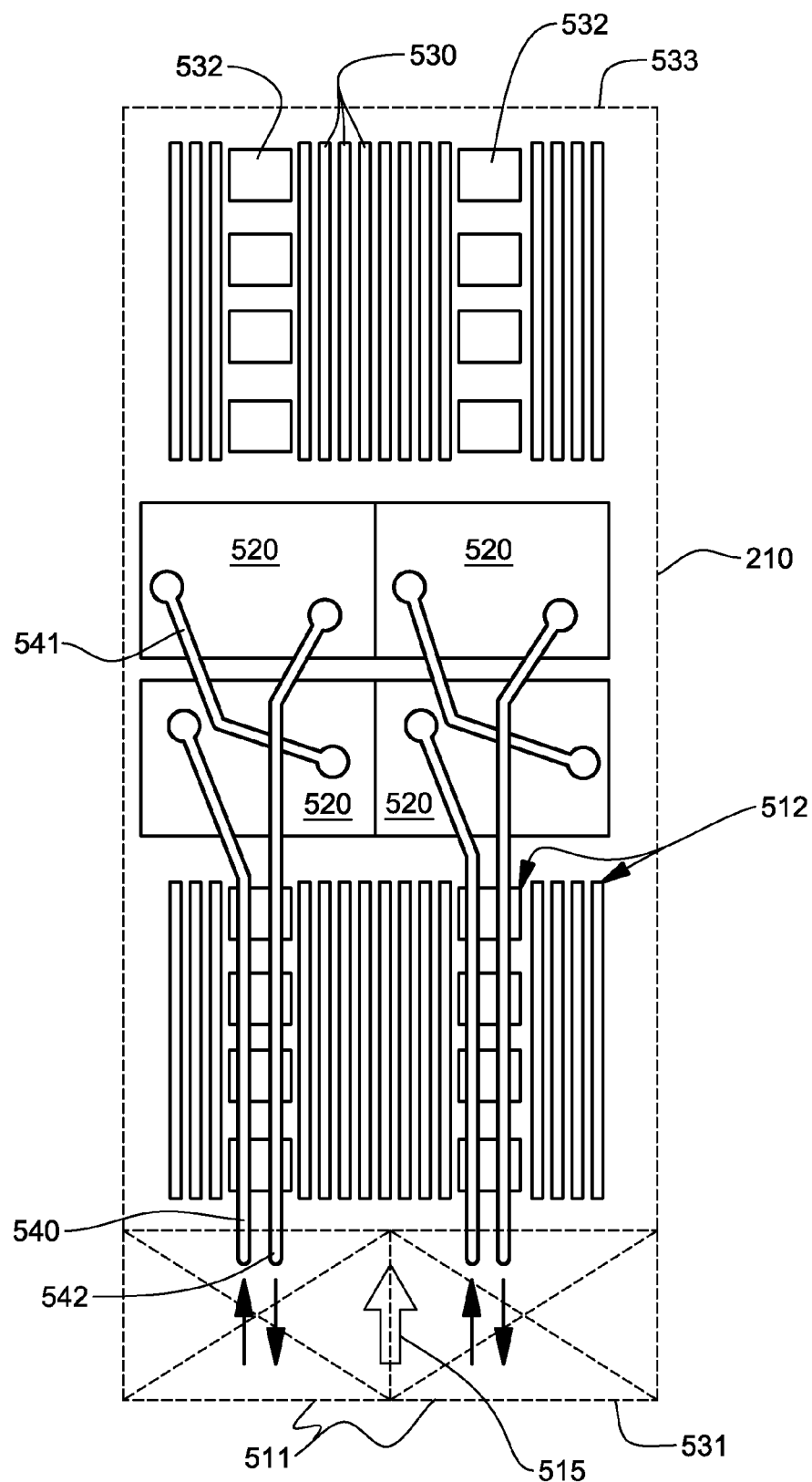
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
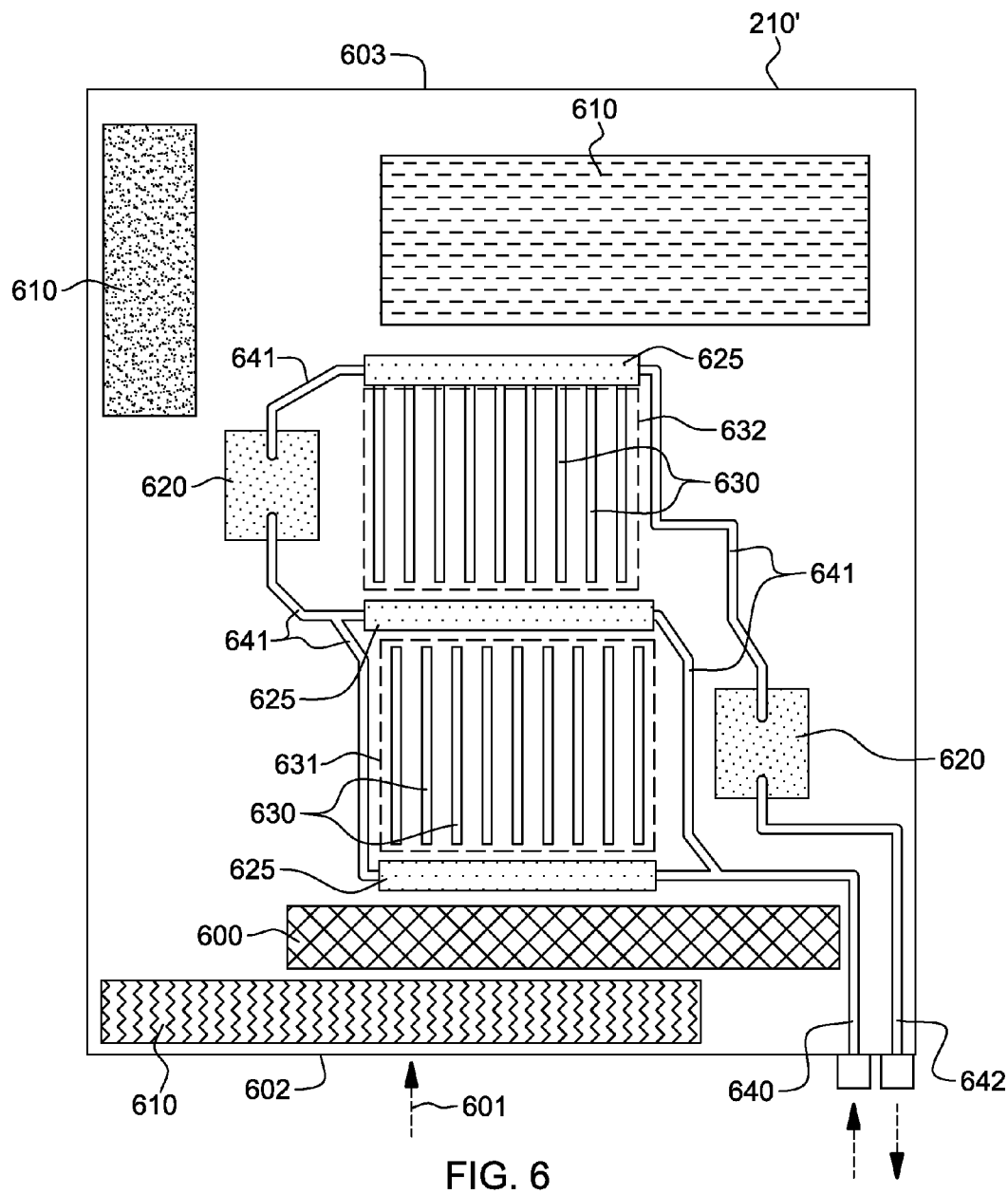
FIG. 6 is a plan view of another embodiment of an electronic system layout for a liquid-cooled electronics rack, and illustrating multiple coolant-cooled cold plates and multiple coolant-cooled cold rails coupled in fluid communication, in accordance with one or more aspects of the present invention.

FIG. 6 illustrates another embodiment of a cooled electronic system 210' component layout, wherein one or more air-moving devices 600 provide forced air flow 601 to cool multiple components 610 within electronic system 210'. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated liquid-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625.

In many cases, one or more electronic components (e.g., processors) in one or more electronic systems (e.g., servers) of a rack unit might run at different states dissipating different amounts of power. Additionally, in another case of uneven power dissipation, electronic systems in an electronics rack might have different numbers of electronic components, such as processors, dissipating different amounts of power. In such cases, the liquid-coolant flow rate within the coolant-cooled rack is typically decided based upon the hottest component(s) in the system, or in the rack of electronic systems. The hottest component is optimally cooled, but other components may be over-cooled, consuming more cooling power than necessary.

Advantageously, disclosed herein are cooling methods and cooling apparatuses with various coolant-cooled cold plate designs for actively controlling a physical characteristic of the cold plates to dynamically alter at least one of thermal or fluid dynamic performance of the cold plate when cooling one or more electronic components. The monitored variable could comprise, as one example, a temperature associated with at least one of the coolant-cooled cold plate, or the one or more electronic components being cooled by the coolant-cooled cold plate. Dynamically altering the thermal and hydrodynamic performance of the cold plate can be employed to optimally cool the electronic component, while at the same time reducing cooling power consumption.

Disclosed herein are various embodiments of cold plates for actively controlling cooling of electronic components so as to, for example, optimally cool electronic components in a coolant-cooled electronics rack comprising multiple electronic systems with multiple heat-generating electronic components being cooled by multiple coolant-cooled cold plates. Actively controlling configuration of a cold plate may, in one embodiment, include dynamically reconfiguring a coolant flow cross-section through the cold plate based on the monitored variable. In an alternate configuration, actively controlling cold plate configuration might include dynamically reconfiguring the cold plate to adjust height of a jet orifice plate within the cold plate relative to a target surface, for example, of the cold plate. Numerous implementations of the active control concept disclosed herein are described below with reference to FIGS. 7A-15C.

Figure 7A:
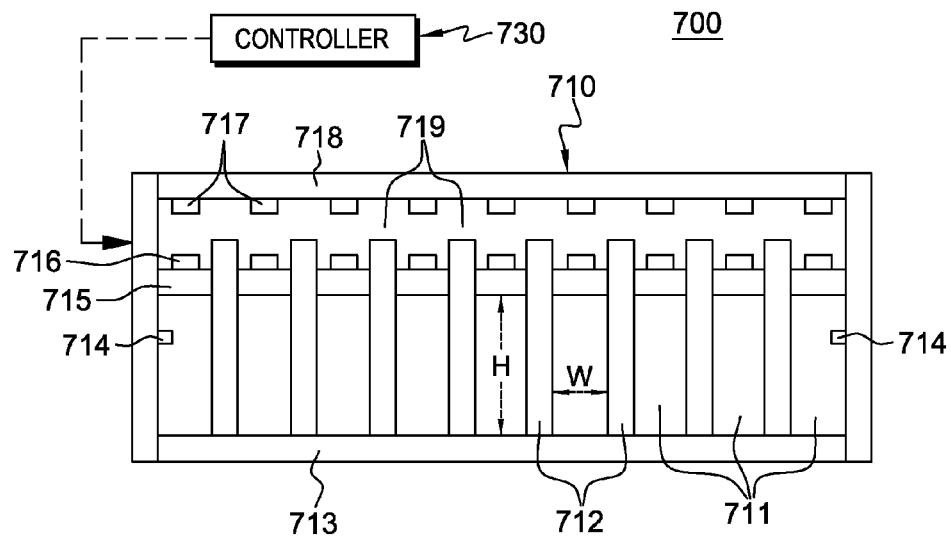
FIG. 7A is a cross-sectional elevational view of one embodiment of a cooling apparatus comprising a coolant-cooled cold plate with an adjustable physical characteristic, in accordance with one or more aspects of the present invention.
Figure 7B:
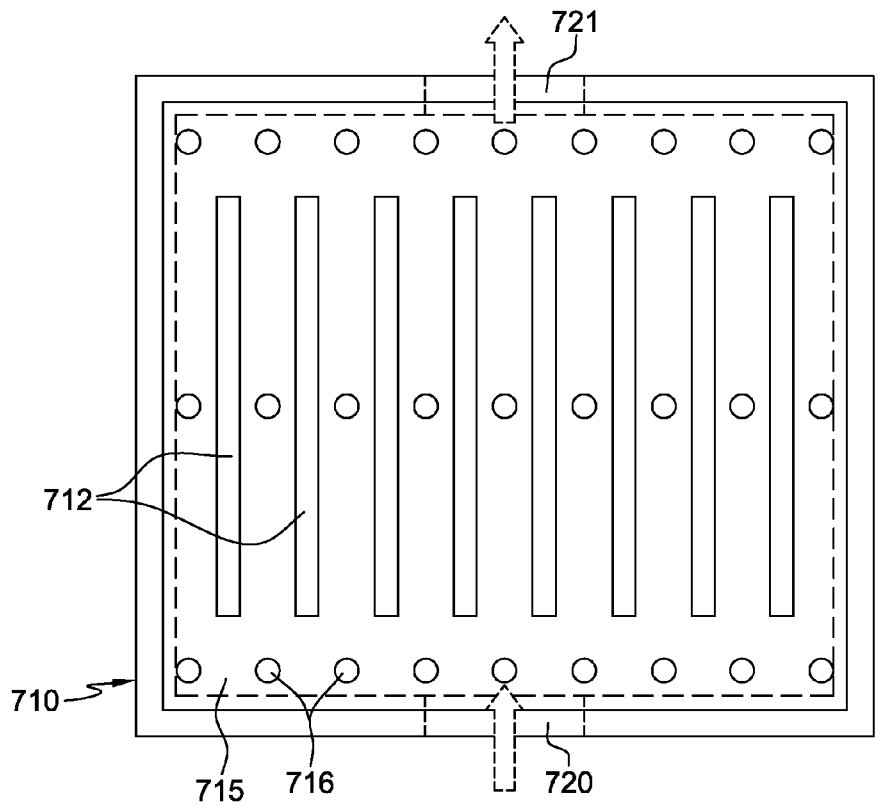
FIG. 7B is a plan view of one embodiment of the coolant-cooled cold plate of FIG. 7A, in accordance with one or more aspects of the present invention.

Referring first to FIGS. 7A & 7B, one embodiment of a cooling apparatus 700, in accordance with one or more aspects of the present invention, is illustrated. Cooling apparatus 700 includes a coolant-cooled cold plate 710 and a controller 730 for actively controlling configuration, and thus a physical characteristic, of the coolant-cooled cold plate. The coolant-cooled cold plate 710 includes, in this embodiment, a plurality of parallel-extending, coolant-carrying channels 711 separated by channel walls 712. A coolant flow cross-section through a single coolant-carrying channel of the plurality of coolant-carrying channels 711 is determined by a width 'W' and a height 'H' of the coolant-carrying channel. As described herein, by adjusting the height 'H' of the coolant flow channels, the coolant flow cross-section through the channels, as well as through the coolant-cooled cold plate, can be automatically, dynamically controlled. Automatically controlling the coolant flow cross-sections through the channels, and thus through the cold plate, is one example of actively controlling (or dynamically varying), based on a monitored variable, a physical configuration of the coolant-cooled cold plate to alter at least one of the thermal or fluid dynamic performance of the coolant-cooled cold plate.

In the depicted embodiment, an adjustable mid-plate 715 is provided, which is controlled by controller 730 to adjust the height 'H' of the parallel, coolant-carrying channels 711 relative to a base plate 713 of coolant-cooled cold plate 710. In this example, adjustable mid-plate 715 is magnetically adjustable, with permanent magnets 716 being affixed to or integrated within adjustable mid-plate 715, and controllable magnets 717 associated with an upper plate 718 of coolant-cooled cold plate 710. By controlling the magnetic force applied by controllable magnets 717, including polarity of the magnets, the adjustable mid-plate 715 can be moved to adjust the effective channel height 'H' of the plurality of parallel, coolant-carrying channels 711. As noted, in this implementation, the adjustable channel height is a physical characteristic of the coolant-cooled cold plate that is being changed via control of the magnetic force being applied to the adjustable mid-plate 715. Hard stops 714 are provided, for example, at a desired minimum channel height 'H'.

Coolant flows into the parallel, coolant-carrying channels 711 via one or more coolant inlets 720 and egresses via one or more coolant outlets 721. Note that the space 719 between adjustable mid-plate 715 and upper plate 718 of the coolant-cooled cold plate may be filled with coolant, for example, to facilitate heat transfer to upper plate 718 of the cold plate. In such a case, however, the coolant flow is through (or principally through) the plurality of parallel, coolant-carrying channels 711.

Controller 730 may be within a common electronic subsystem containing the coolant-cooled cold plate 710, or could be disposed in another electronic system within the same electronics rack, or even remote from the electronics rack containing the coolant-cooled cold plate (with the adjustable physical characteristic). The controller implements a control process for automatically controlling the position of adjustable mid-plate 715, and thus for controlling (in this example) coolant flow cross-section through the plurality of coolant-carrying channels, and therefore through the cold plate. Thus, controller 720 actively controls a physical characteristic of the coolant-cooled cold plate by changing cold plate configuration, and this active control is to, for instance, optimally cool the associated electronic components being cooled by the cold plate, and at the same time, reduce cooling power consumption. In one embodiment, the adjustable mid-plate is adjusted by the controller to reconfigure the effective channel height based on, for example, heat dissipated by the associated electronic component(s) being cooled, and/or the coolant flow rate through the coolant-cooled cold plate.

The adjustable mid-plate 715 may contain grooves or slots corresponding to each channel wall 712 for movement normal to the parallel-extending, coolant-carrying channel lengths. As noted, polarity of the controllable magnets 717 associated with the upper plate 718 of the cold plate can be toggled, and the magnetic strength can be varied, to attract or repel the adjustable mid-plate as desired. Thus, by controlling the magnetic force between the adjustable mid-plate and the upper plate, the effective channel height can be controlled and adjusted.

Figure 8A:
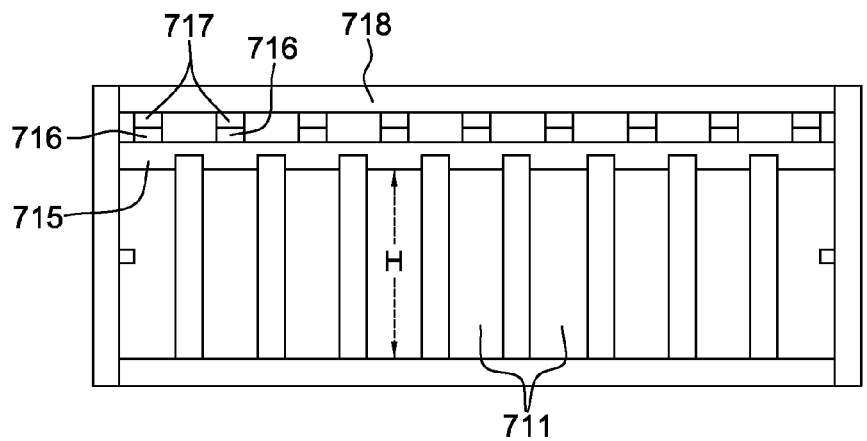
FIG. 8A is a cross-sectional elevational view of the coolant-cooled cold plate of FIGS. 7A & 7B, with the adjustable mid-plate thereof shown at a first stage, in accordance with one or more aspects of the present invention.
Figure 8B:
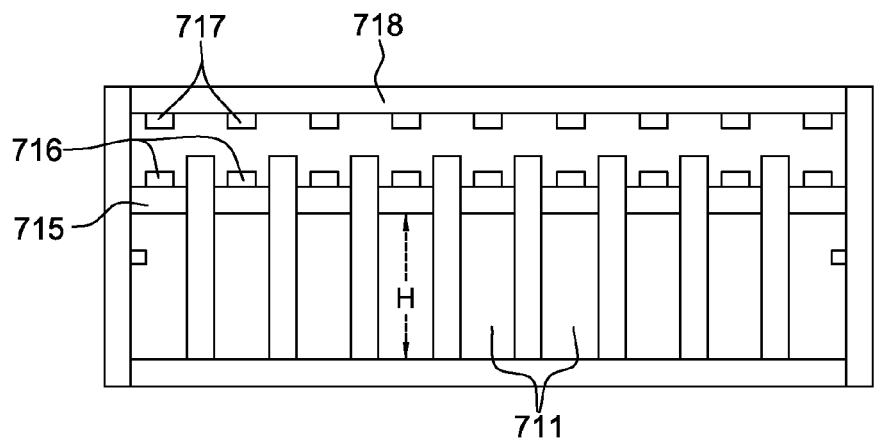
FIG. 8B is a cross-sectional elevational view of the coolant-cooled cold plate of FIGS. 7A & 7B, with the adjustable mid-plate thereof shown at a second stage, in accordance with one or more aspects of the present invention.
Figure 8C:
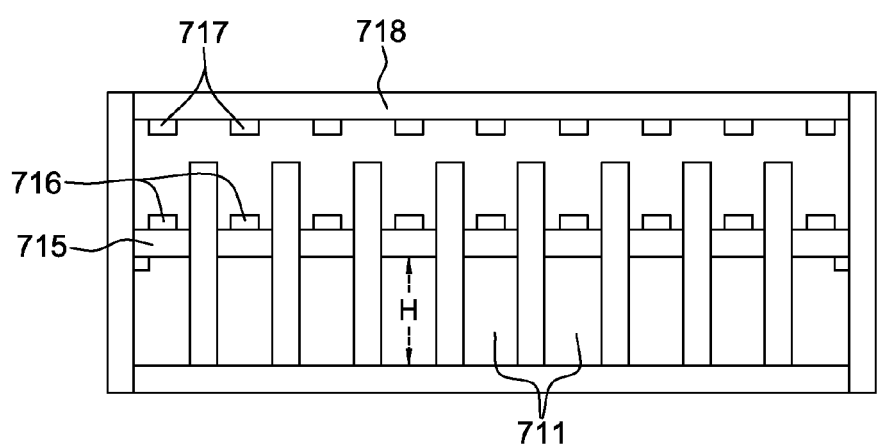
FIG. 8C is a cross-sectional elevational view of the coolant-cooled cold plate of FIGS. 7A & 7B, with the adjustable mid-plate thereof shown at a third stage, in accordance with one or more aspects of the present invention.

FIGS. 8A-8C depict three different stages of mid-plate adjustment.

In FIG. 8A, a stage 1 position is illustrated, wherein the controllable magnets have opposite polarity to the permanent magnets affixed to the adjustable mid-plate, such that the mid-plate is attracted to the top plate. The result is a maximum channel height 'H' for coolant flow through the coolant-cooled cold plate. This in turn results in a relatively lower Reynolds Number (Re) for the same coolant mass flow rate through the cold plate.

FIG. 8B depicts a stage 2 configuration, wherein the magnetic components 717 on upper plate 718 could have similar polarity, or partially similar and partially opposite polarity, as the permanent magnets 716 on adjustable mid-plate 715. The magnetic strength of the magnetic components 717 could be varied as well so that the adjustable mid-plate stays at an intermediate position, such as illustrated in FIG. 8B. In this position, the effective channel height 'H' is lower, and thus, the coolant flow cross-section through the respective channels and through the cold plate is smaller, resulting in a relatively higher Reynolds Number for the same coolant mass flow rate (that is, compared with that of stage 1).

In FIG. 8C, a stage 3 is illustrated, wherein the adjustable magnetic components 717 on upper plate 718 have similar polarity as the permanent magnets 716 on adjustable mid-plate 715, so that the plates repel. The magnetic strength of the magnetic components 717 on upper plate 718 can be adjusted so that the adjustable mid-plate is farthest away from the upper plate, resulting in a smallest possible effective channel height 'H'. In this implementation, the adjustable mid-plate 715 may rest on hard stops 714 disposed, for example, on the inner side walls of the coolant-cooled plate. As illustrated, in stage 3, a smaller coolant flow cross-section is presented through the plurality of parallel coolant channels, and thus, through the cold plate (that is, compared with that of stage 2). This smaller flow cross-section results in relatively higher Reynolds Number for the same coolant mass flow rate.

It should be noted that the convective heat transfer rates are higher for larger Reynolds Number flows. Thus, for a given coolant mass flow rate through the coolant-cooled cold plate, stage 3 offers a higher heat transfer rate compared to stage 2, and stage 2 offers a higher heat transfer rate compared to stage 1.

Figure 9:
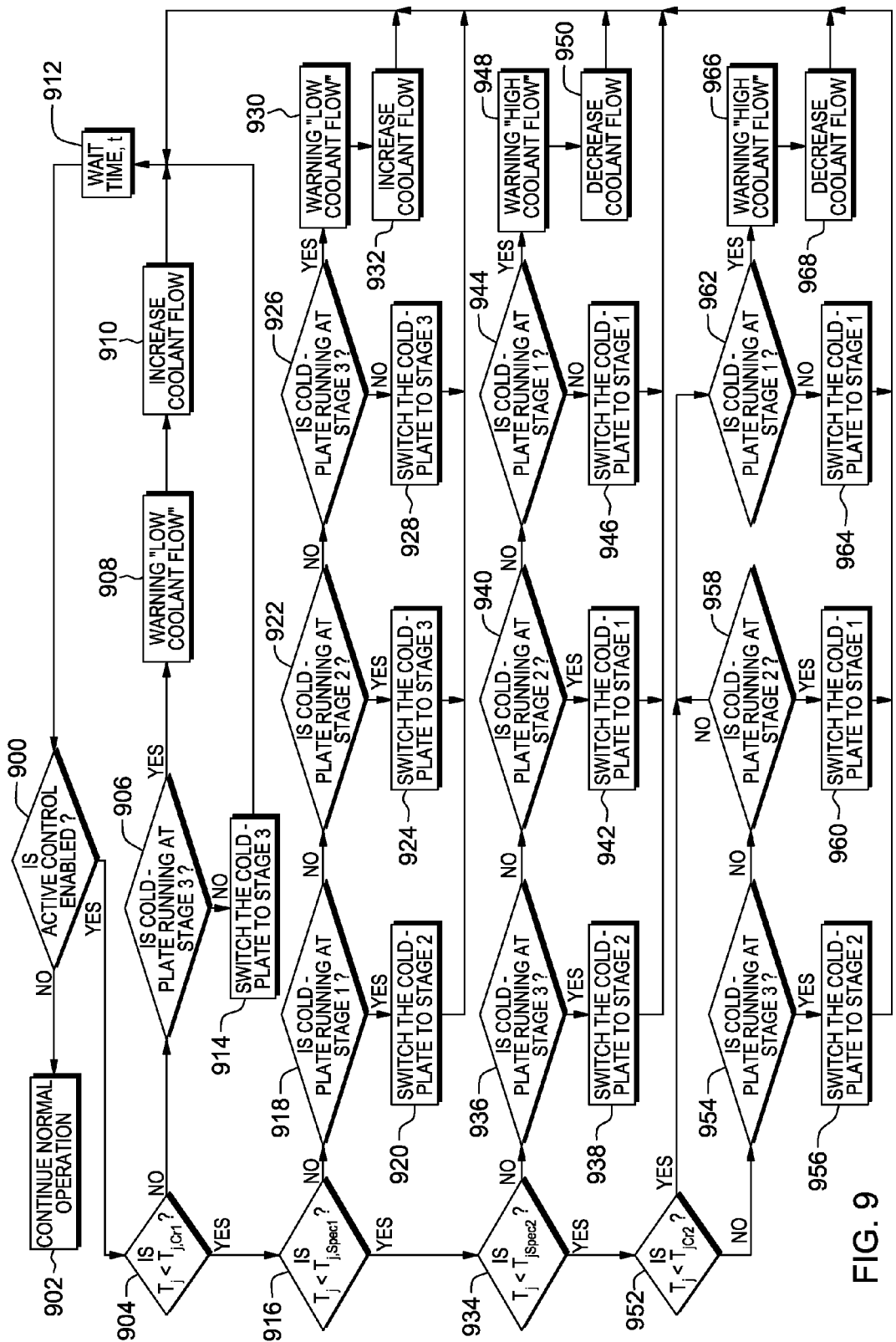
FIG. 9 depicts one embodiment of a process for actively controlling physical configuration of a coolant-cooled cold plate, in accordance with one or more aspects of the present invention.

FIG. 9 depicts one embodiment of a process for actively controlling operation of a coolant-cooled cold plate such as depicted in FIGS. 7A & 7B, between the three stages of FIGS. 8A-8C. Table 1 below contains nomenclature for the following discussion of FIGS. 9-11.

TABLE 1

| SYMBOL | DEFINITION |
|---|---|
| A | Channel cross-sectional area |
| $A_1$ | Channel cross-sectional area for relatively taller channels |
| $A_2$ | Channel cross-sectional area for relatively shorter channels |
| $D_h$ | Hydraulic Diameter of the channels |
| $D_{h,1}$ | Hydraulic Diameter of the relatively taller channels |
| $D_{h,2}$ | Hydraulic Diameter of the relatively shorter channels |
| h | Convective heat transfer coefficient |
| $h_1$ | Convective heat transfer coefficient in the developed flow regime for the relatively taller channels |
| $h_2$ | Convective heat transfer coefficient in the developed flow regime for the relatively shorter channels |
| k | Thermal conductivity of the coolant |
| $l_e$ | Thermal development length |
| $l_{e,1}$ | Thermal development length for relatively taller channels |
| $l_{e,2}$ | Thermal development length for relatively shorter channels |
| $\dot{m}$ | Coolant mass flow rate |
| Nu | Nusselt Number |
| P | Perimeter of the channel cross-section |
| $P_1$ | Perimeter of the channel cross-section for relatively taller channels |
| $P_2$ | Perimeter of the channel cross-section for relatively shorter channels |
| Pr | Prandtl Number of the coolant (eg. Water 7, air 0.7, etc.) |
| Re | Reynolds Number |
| $Re_1$ | Reynolds Number for relatively taller channels |
| $Re_2$ | Reynolds Number for relatively shorter channels |
| $T_j$ | CPU Junction Temperature (that is, Device Temperature) |
| $T_{j,Cr1}$ | Higher/Upper Critical Temperature Value |
| $T_{j,spec1}$ | Upper Temperature specification |

TABLE 1-continued

| SYMBOL | DEFINITION |
|---|---|
| $T_{j,\,spec2}$ | Lower Temperature specification |
| $T_{j,\,Cr2}$ | Lower Critical Temperature value |
| | (Note: $T_{j,\,cr1} > T_{j,\,spec1} > T_{j,\,spec2} > T_{j,\,Cr2}$) |
| µ | Coolant viscosity |

In the example of FIG. 9, active control processing is based on electronic component junction temperature ($T_j$). In one example, the electronic component may comprise one or more processors, and the junction temperature is employed as a measure of the heat dissipated by the one or more processors being cooled by the coolant-cooled cold plate.

Upon entering the control loop, processing determines whether active control is enabled 900. If "no", then the control loop is exited, and the system continues with normal operation 902. In this case, the coolant-cooled cold plate might remain in a previously set configuration. If, however, active control is enabled, then processing determines whether the junction temperature ($T_j$) is less than a first critical value ($T_{j,Cr1}$) 904. If "no", then processing determines whether the coolant-cooled cold plate is operating at stage 3 906, and if "yes", a "Low Coolant Flow" warning is issued, and coolant flow rate through the cold plate is increased 910. The controller then waits a time interval t 912 before again checking whether active cooling is enabled 900. If the junction temperature is greater than the first critical value, and the coolant-cooled cold plate is not operating at stage 3, the controller switches the cold plate to stage 3 operation 914, and then waits time interval t 912 before returning to check whether active control is enabled.

If the junction temperature ($T_j$) is less than the first critical temperature value ($T_{j,Cr1}$), processing determines whether the junction temperature ($T_j$) is less than a first specified junction temperature ($T_{j,spec1}$) 916, wherein the first specified junction temperature ($T_{j,spec1}$) and a second specified junction temperature ($T_{j,spec2}$) define a desired, specified operating range for the monitored junction temperature ($T_j$). If the junction temperature ($T_j$) is not less than the first specified junction temperature ($T_{j,spec1}$), processing determines whether the cold plate is operating at stage 1 918. If "yes", then the controller switches the cold plate to stage 2 920, and waits time interval t 912 before again cycling through the control loop by determining whether active mode is enabled 900. If "no", that is, if the cold plate is not operating at stage 1, processing determines whether the cold plate is operating at stage 2 922. If "yes", then processing switches the cold plate to stage 3 924, and waits time interval t 912 before determining whether active control is enabled 900. If the cold plate is not operating at stage 2 922, processing determines whether the cold plate is operating at stage 3 926. If "yes", then a "Low Coolant Flow" warning is issued, and steps are taken to increase the coolant flow rate 932. Processing then waits time interval t 912 before returning to determine whether active control is enabled 900. If the cold plate is not operating at stage 3 926, then processing switching the cold plate to stage 3 928, and waits time interval t 912 before determining whether active control is enabled 900.

If junction temperature ($T_j$) is less than the first specified junction temperature ($T_{j,spec1}$), processing determines whether junction temperature is less than the second specified junction temperature ($T_{j,spec2}$) 934. If "no", then processing determines whether the cold plate is operating at stage 3 936. If "yes", then the cold plate is switched to stage 2 938, and the system waits time interval t 912 before again checking whether the active control is enabled 900. If the cold plate is not operating at stage 3, then processing determines whether the cold plate is operating at stage 2 940. If "yes", then the controller switches the cold plate to stage 1 942, and waits time interval t 912 before again checking to determine whether active control is enabled 900. If the cold plate is not operating at stage 2 940, then processing determines whether the cold plate is operating at stage 1 944. If "yes", then a "High Coolant Flow" warning is issued, and steps are taken to decrease the coolant flow rate 950. Processing then waits time interval t 912 before determining whether active control is enabled 900. If the cold plate is not operating at stage 1 944, then processing switches the cold plate to stage 1 946, and the system waits time interval t 912 before checking whether active mode is enabled, and repeating the control loop of FIG. 9.

If junction temperature ($T_j$) is less than the second specified junction temperature ($T_{j,spec2}$) 934, then processing determines whether the junction temperature is less than a second critical junction temperature ($T_{j,Cr2}$) 952, wherein the second critical temperature value ($T_{j,Cr2}$) is less than the second specified junction temperature ($T_{j,spec2}$). If "no", then processing determines whether the cold plate is operating at stage 3 954, and if "yes", the cold plate is switched to stage 2 956, and processing waits time interval t 912 before checking if active control is enabled 900. If the cold plate is not operating at stage 3 954, then processing determines whether the cold plate is operating at stage 2 958. If "yes", the cold plate is switched to stage 1 960, and the system waits time interval t 912 before checking if active control is enabled 900. If the cold plate is not operating at stage 2 958, processing determines whether the cold plate is running at stage 1 962. If "yes", then a "High Coolant Flow" warning is issued 966, and coolant flow rate is decreased 968, after which processing waits time interval t 912 before determining whether active control is enabled 900, to repeat the process. If the cold plate is not operating at stage 1 962, then processing switches the cold plate to stage 1 964, and waits for time interval t 912 before checking if active control is enabled 900.

If the junction temperature ($T_j$) is less than the second critical value ($T_{j,Cr2}$), processing determines whether the cold plate is operating at stage 1 962, and if "yes", issues the "High Coolant Flow" warning 966 and decreases the coolant flow rate 968. Processing then waits time interval t 912 before checking whether active control is enabled 900. If the cold plate is not operating at stage 1 962, then the system switches the cold plate to stage 1 964, and processing waits time interval t 912, before checking whether active control is enabled 900.

Figure 10:
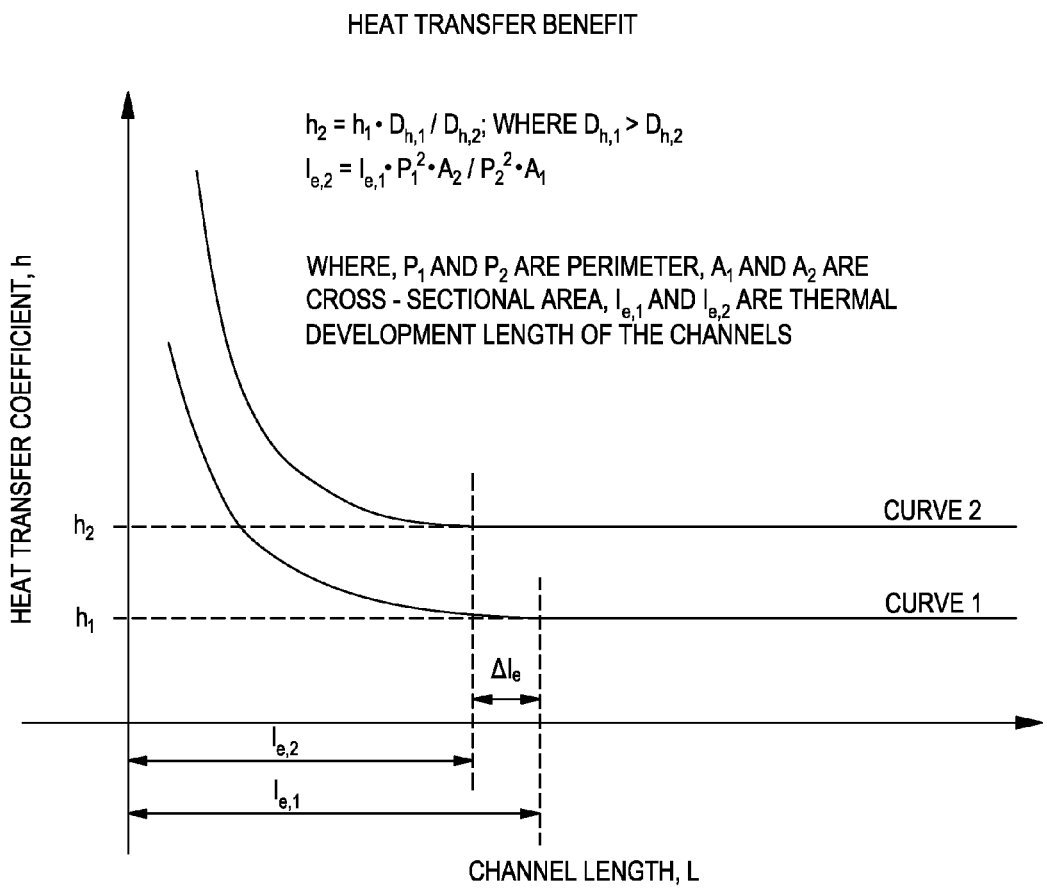
FIG. 10 is a graph illustrating a heat transfer benefit by dynamically modifying cross-sectional flow area through one or more channels of a coolant-cooled cold plate, in accordance with one or more aspects of the present invention.

FIG. 10 represents the heat transfer benefit that can be obtained by reducing channel cross-sectional area. For laminar internal (channel) flows, in the developed flow regime, the Nusselt number (Nu) is constant. For constant temperature boundary conditions, Nu=3.66 and for constant heat flux boundary conditions, Nu=4.36. The Nusselt number can be expressed as Nu=h×$D_h$/k, where h is the convective heat transfer coefficient, $D_h$ is the hydraulic diameter of the channel(s) and k is the thermal conductivity of the coolant. Let $D_{h,1}$ represent the hydraulic diameter of the taller channel(s) and $D_{h,2}$ represent the hydraulic diameter of the shorter channel(s). Since the taller channels have larger cross-section for coolant flow, $D_{h,1} > D_{h,2}$. For a fixed coolant, the thermal conductivity (k) of the coolant can be assumed to be constant. Thus, the convective heat transfer coefficient in the developed flow regime for the shorter channels ($h_2$) with respect to that of the taller channels ($h_1$) can be estimated using the Nusselt number relationship.

$Nu = h_1 \times D_{h,1}/k = h_2 \times D_{h,2}/k$. Thus, $h_2 = h_1 \times D_{h,1}/D_{h,2}$. Thus, for $D_{h,1} > D_{h,2}$, $h_2$ is greater than $h_1$ by the inverse ratio of the corresponding hydraulic diameters.

In general, the channel flow regime can be divided into 2 sections, that is, a thermally developing flow regime and a thermally developed flow regime. In the thermally developing flow regime the heat transfer rates are very high, while in the thermally developed region, the heat transfer rates reach a constant value. Thus, by having a longer thermally developing flow region higher heat transfer rates can be obtained. The thermal development length ($l_e$) for laminar flows is generally expressed as $l_e = 0.055 \times Re \times Pr \times D_h$, where Re is the flow Reynolds Number, Pr is the Prandtl number and is generally constant for a given coolant and $D_h$ is the hydraulic diameter. The Reynolds Number can be expressed as $Re = 4\dot{m}/\mu P$ where, $\dot{m}$ is the coolant mass flow rate and $\mu$ is the coolant viscosity and P is the perimeter of the channels cross-section. For the same coolant mass flow rate, the Reynolds Number for the shorter channels with respect to that of the taller channels can be expressed as:

$$\frac{Re_2}{Re_1} = \frac{P_1}{P_2}.$$

Thus, for $P_1 > P_2$, the $Re_e$ is greater than $Re_1$ by the inverse ratio of the corresponding perimeters. Thus, the thermally developing length for the shorter channels ($l_{e,2}$) with respect to that of the taller ($l_{e,1}$) can be expressed as:

$$\frac{l_{e,2}}{l_{e,1}} = \frac{P_1 D_{h,2}}{P_2 D_{h,1}}.$$

It can be mathematically shown that in general $l_{e,2} > l_{e,1}$.

Figure 11:
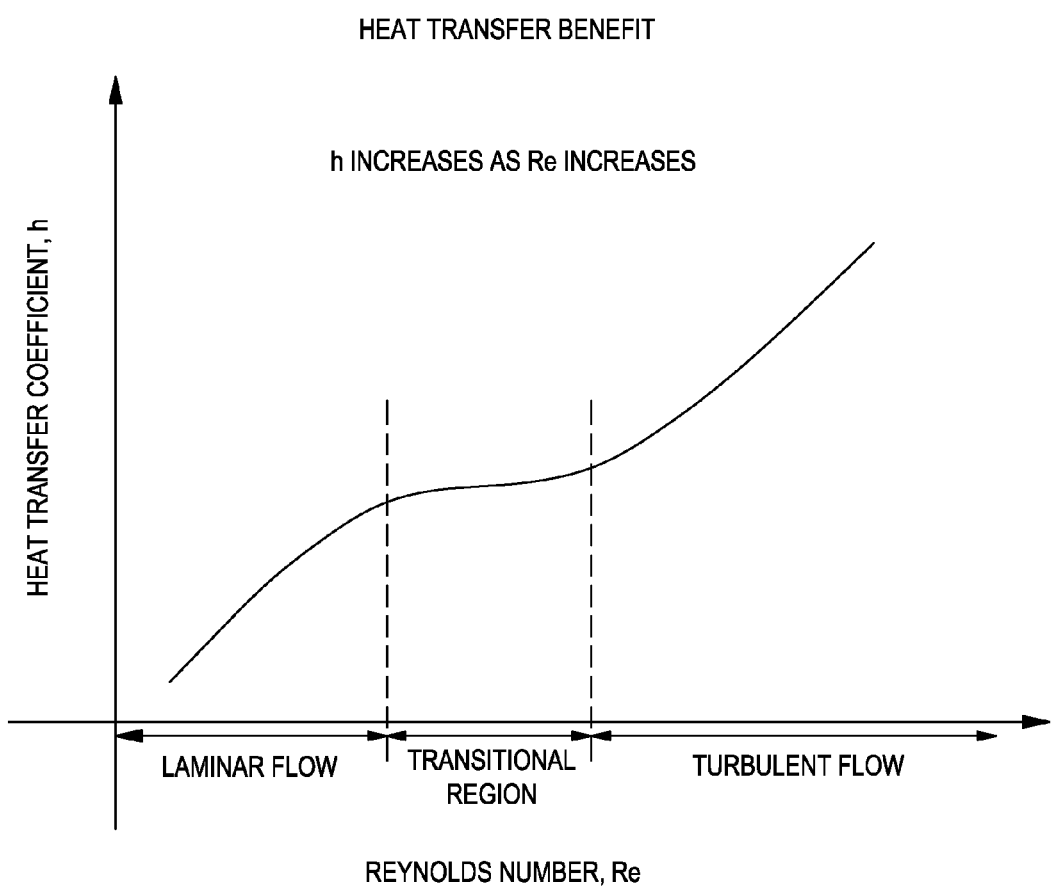
FIG. 11 is a graph illustrating change in Reynolds Number (Re), and the effect thereof on the heat transfer coefficient within a coolant-cooled cold plate, in accordance with one or more aspects of the present invention.

Also, in general, the heat transfer coefficient increases with the Reynolds Number (see FIG. 11). Thus by increasing the flow Reynolds Number, the coolant flow through the cold-plate could be transitioned from laminar to turbulent flow, resulting in higher heat transfer rates. Thus the shorter channels have triple benefit on the heat transfer rate—relatively longer thermally developing region, increased heat transfer rates in the thermally developed region and possibility of transition to turbulent flow. However, this increased benefit comes at a price of increased pressure drop across the cold plate resulting in increased coolant pumping power. This increased pumping power is local to the cold-plates and its effect on the overall system (data center level) could possibly be negligible.

As noted, FIGS. 12A-15C depict different embodiments of a dynamically variable, coolant-cooled cold plate, in accordance with one or more aspects of the present invention.

Figure 12A:
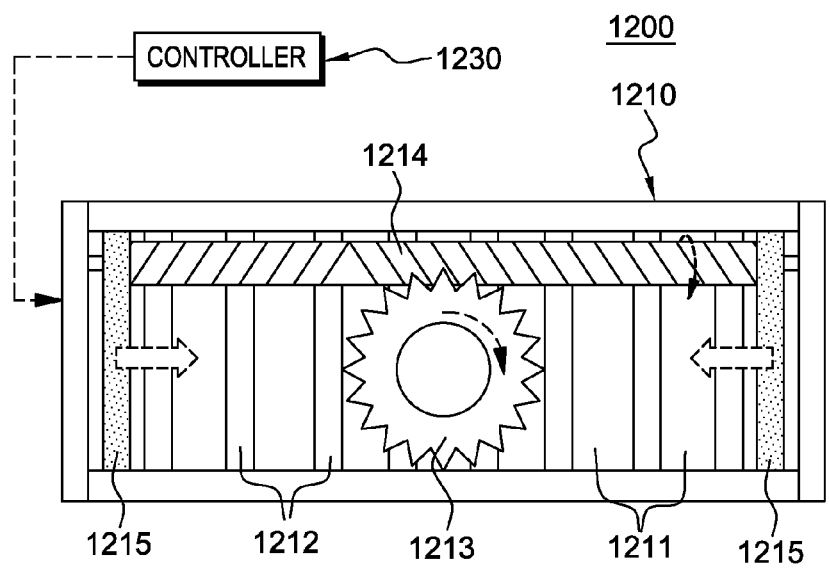
FIG. 12A depicts an alternate embodiment of a cooling apparatus comprising a coolant-cooled cold plate with an adjustable physical characteristic, and illustrating the cold plate in a first stage, in accordance with one or more aspects of the present invention.
Figure 12B:
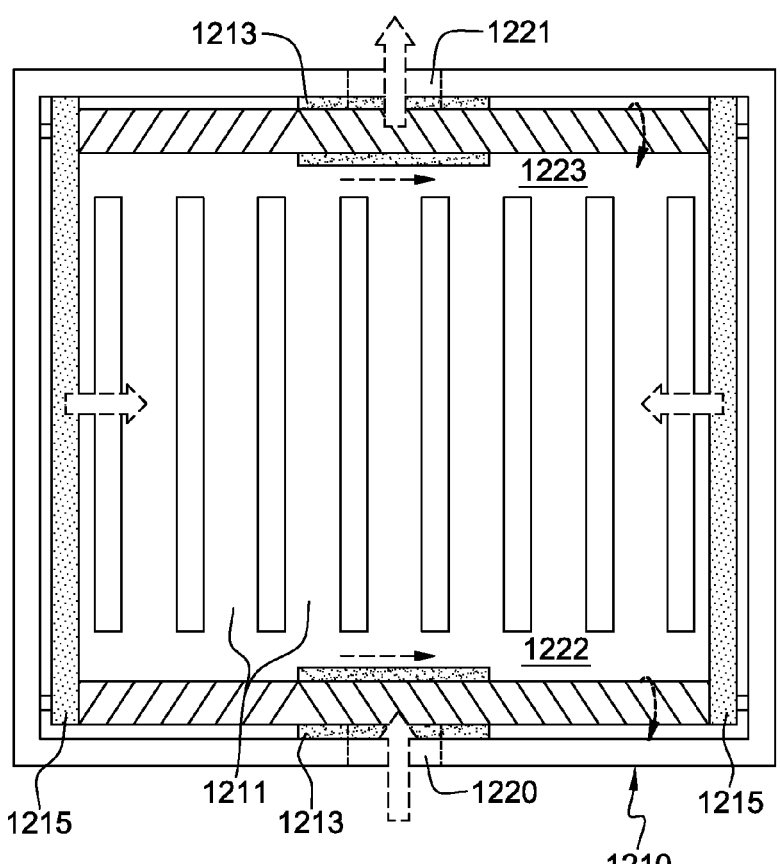
FIG. 12B is a plan view of the coolant-cooled cold plate of FIG. 12A, in accordance with one or more aspects of the present invention.

In FIGS. 12A & 12B, a cooling apparatus 1200 is illustrated comprising a coolant-cooled cold plate 1210 and a controller 1230 for actively controlling a physical configuration, and thus a physical characteristic, of the coolant-cooled cold plate. The coolant-cooled cold plate 1210 includes, in this embodiment, a plurality of parallel-extending, coolant-carrying channels 1211 separated by channel walls 1212. In this example, the coolant flow cross-section through the coolant-carrying channels is constant, but the number of channels carrying coolant flow is varied by adjusting positioning of one or more adjustable isolation plates 1215 to selectively control the number of channels within the cold plate with coolant flow.

In the illustrated embodiment, two isolation plates are shown laterally movable (or translatable) to reduce the effective number of channels (based, for instance, on the heat being dissipated by the one or more electronic components being cooled by then cold plate and the coolant flow rate through the cold plate). The adjustable plates 1215 are mounted on a pair of threaded shafts 1214 that are engaged by one or more gears 1213 (e.g., in the form of a worm-gear arrangement) to provide the rotational motion to the shafts 1214. In other configurations, shafts 1214 could be rotatable without using a rotational gear 1213, such as illustrated in FIGS. 12A & 12B. For example, in an alternate configuration, no gear may be included within the cold plate, with a gear arrangement provided outside of the cold plate to synchronously rotate the two shafts.

Coolant flows into the parallel, coolant-carrying channels 1211 via one or more coolant inlets 1220 and egresses via one or more coolant outlet 1221. In the depicted example, the coolant inlet 1220 and coolant outlet 1221 are through respective gears 1213, as illustrated. Channel walls 1212 are separated from gears 1213 such that a coolant supply space 1222 and coolant return space 1223 are provided within the coolant-cooled cold plate 1210. As the gear is rotated, for example, clockwise, due to the threading of the shaft, the shaft also rotates in the clockwise direction. This causes the isolation plates 1215 to move forward towards each other. When the gear is rotated in the counterclockwise direction, the shafts also move counterclockwise, and thus, the isolation plates move away from each other. The isolation plates may be configured such that coolant within the coolant supply space 1222 and coolant return space 1223 is constrained by the laterally-translatable isolation plates 1215 so that one or more outer coolant-carrying channels 1211 of the coolant-carrying cold plate become isolated from the coolant flow through the cold plate. In other configurations, the movable isolation plates could comprise grooves for allowing a reduced coolant flow through the outer channels, notwithstanding translation of the isolation plates towards each other.

FIGS. 12A & 12B depict isolation plates 1215 at a first stage. In this first stage, a maximum number of coolant-carrying channels are carrying coolant flow through the cold plate. This results in a lower Reynolds Number for a same coolant mass flow rate through the cold plate. This stage 1 configuration could also be useful where coolant spreading through the cold plate is required.

Figure 12C:
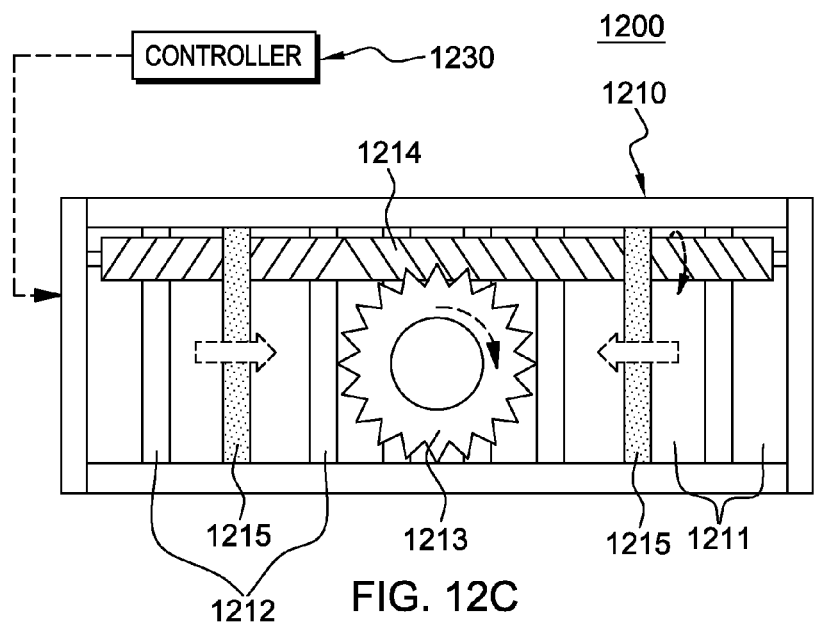
FIG. 12C is a cross-sectional elevational view of the coolant-cooled cold plate of FIGS. 12A & 12B, with the cold plate shown in a second stage, wherein the cold plate is reconfigured to reduce the available cross-sectional flow area through the cold plate, in accordance with one or more aspects of the present invention.
Figure 12D:
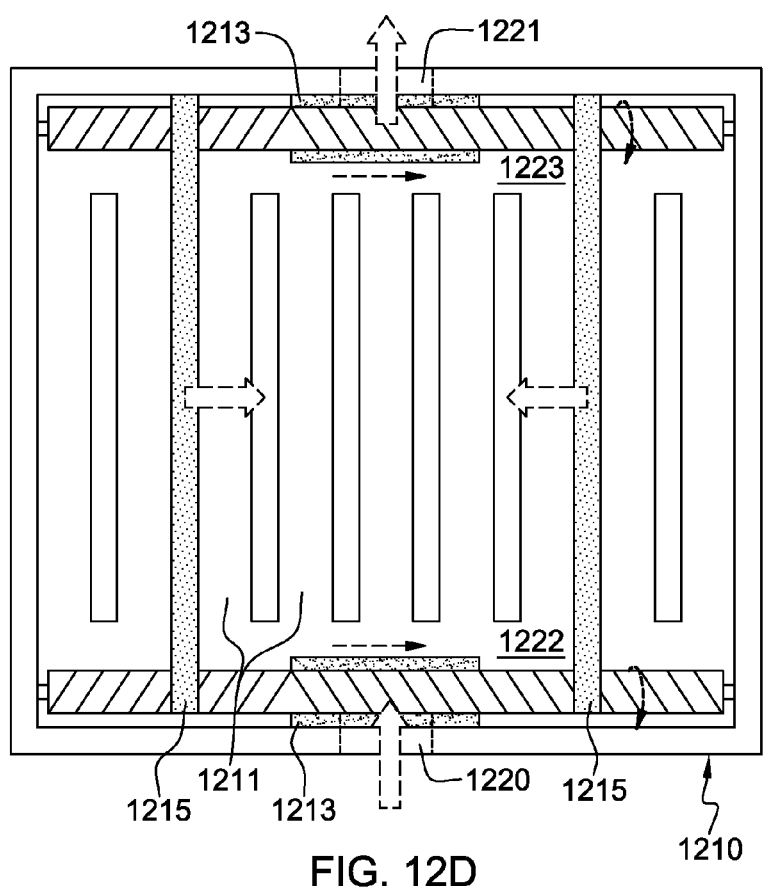
FIG. 12D is a plan view of the coolant-cooled cold plate of FIG. 12C, shown in the second stage, in accordance with one or more aspects of the present invention.

In FIGS. 12C & 12D, a stage 2 configuration is illustrated, wherein isolation plates 1215 are moved partially towards each other, resulting in coolant flow through a reduced number of coolant-carrying channels 1211. This positioning could be useful when some thermal spreading is required through the cold plate.

Figure 12E:
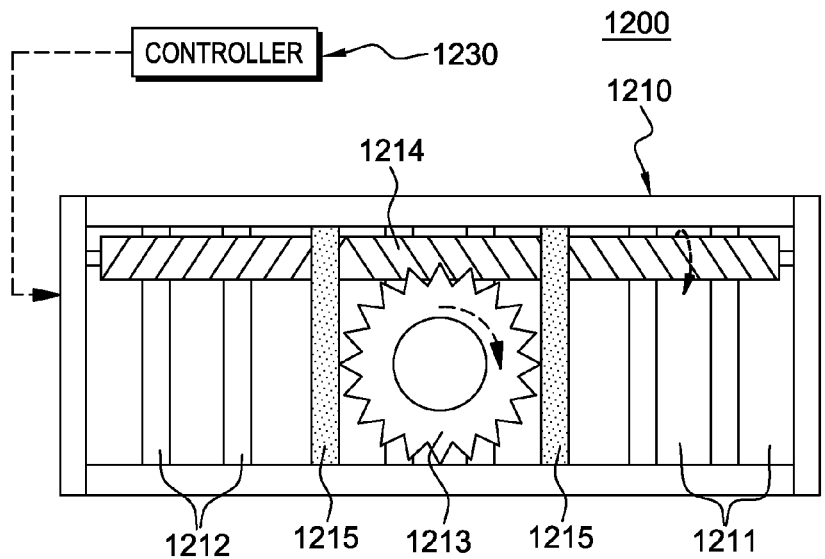
FIG. 12E is a cross-sectional elevational view of the coolant-cooled cold plate of FIGS. 12A-12D, with the cold plate shown in a third stage, wherein the cold plate is reconfigured to further reduce cross-sectional flow area through the cold plate, in accordance with one or more aspects of the present invention.
Figure 12F:
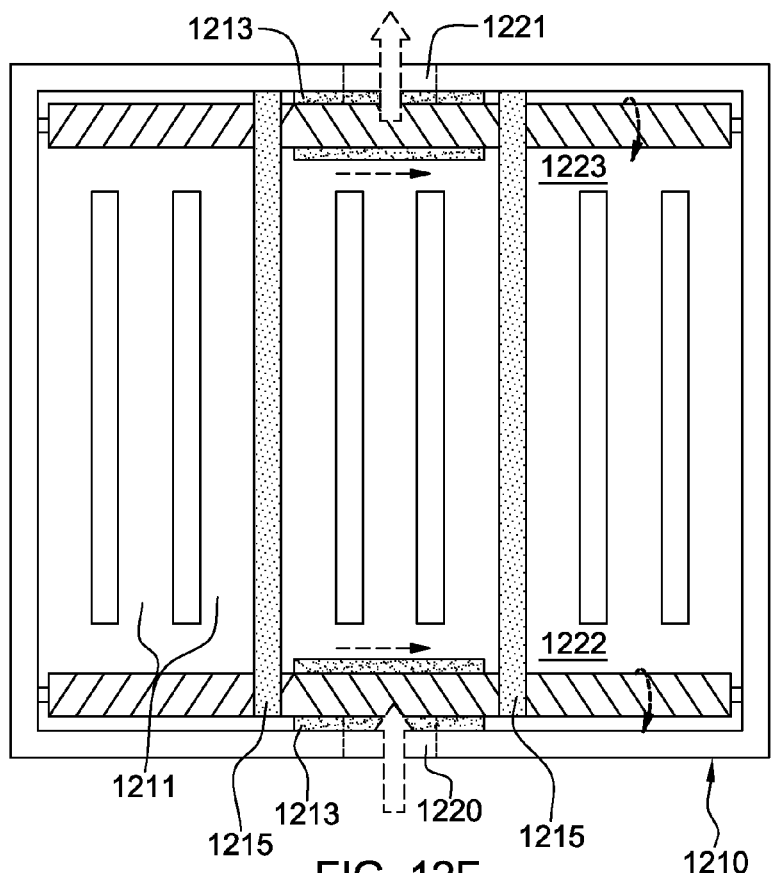
FIG. 12F is a plan view of the coolant-cooled cold plate of FIG. 12E, shown in the third stage, in accordance with one or more aspects of the present invention.

FIGS. 12E & 12F depict a stage 3 for the coolant-cooled cold plate of FIGS. 12A-12D. At this stage, the movable isolation plates 1215 are at a closest position relative to each other, allowing the coolant to flow through a minimum number of channels. This concentrating of the coolant within a reduced number of channels results in a relatively higher Reynolds Number for the same coolant mass flow rate through the cold plate. Note that in one embodiment, the processing of FIG. 9 may be implemented to control positioning of the moveable isolation plates 1215 in the coolant-cooled cold plate 1210 embodiment of FIGS. 12A-12F.

Figure 13A:
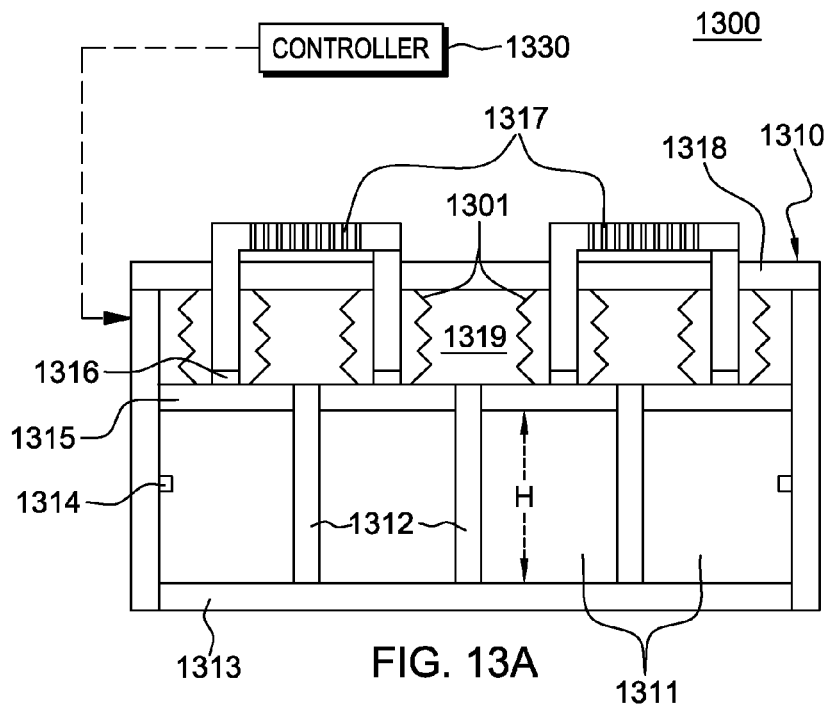
FIG. 13A depicts another embodiment of a cooling apparatus comprising a coolant-cooled cold plate with an adjustable physical characteristic, in accordance with one or more aspects of the present invention.
Figure 13B:
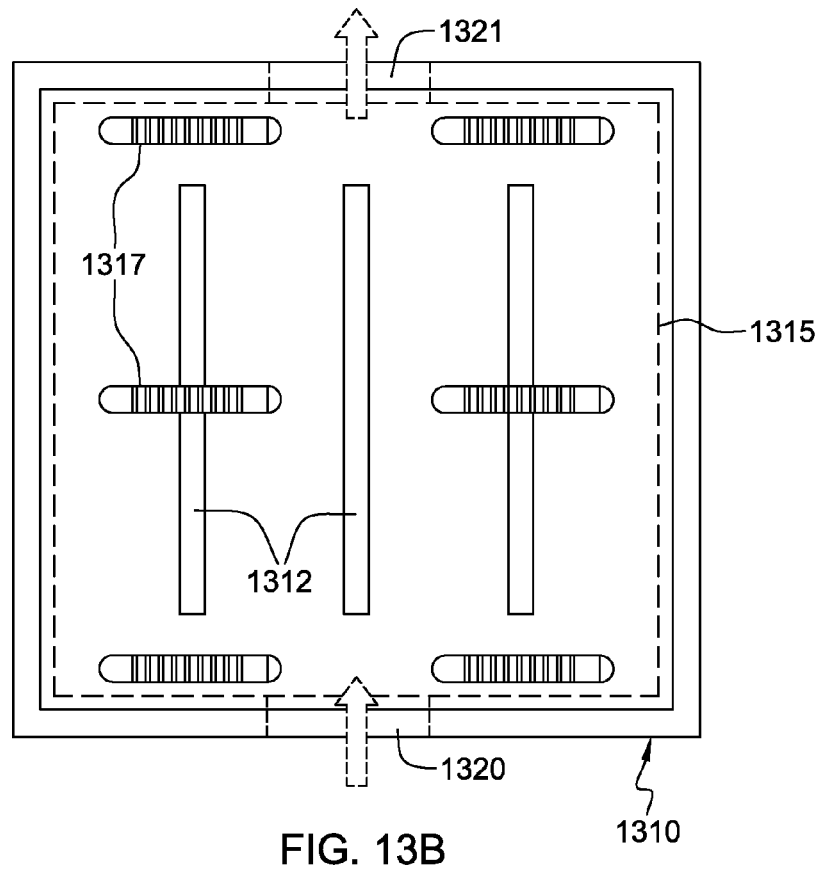
FIG. 13B is a plan view of the coolant-cooled cold plate of FIG. 13A, in accordance with one or more aspects of the present invention.

FIGS. 13A & 13B depict another embodiment of a cooling apparatus, generally denoted 1300, in accordance with one or more aspects of the present invention. Cooling apparatus 1300 includes a coolant-cooled cold plate 1310 and a controller 1330 for actively controlling a physical configuration, and thus a physical characteristic, of the coolant-cooled cold plate. The coolant-cooled cold plate 1310 includes, in this embodiment, a plurality of parallel-extending, coolant-carrying channels 1311 separated by channel walls 1312. A coolant flow cross-section through a single coolant-carrying channel of the plurality of coolant-carrying channels 1311 is determined by a width ('W') and a height ('H') of the coolant-carrying channel. As described herein, by adjusting the height 'H' of the coolant-carrying channels, the coolant flow cross-section through the channels, as well as through the coolant-cooled cold plate, can be automatically, dynamically reconfigured employing, for example, processing such as described above in connection with FIG. 9. This dynamic reconfiguration of the height of the coolant-carrying channels in the example of FIGS. 13A & 13B is an example of a physical reconfiguration of a cold plate which is achieved by dynamically adjusting one or more plates within the cold plate, in accordance with one or more aspects of the present invention.

In the depicted embodiment, an adjustable mid-plate 1315 is provided, which is controlled by controller 1330 to adjust the height 'H' of the parallel, coolant-carrying channels 1311 relative to a base plate 1313 of the coolant-cooled cold plate 1310. In this example, adjustable mid-plate 1315 is magnetically adjustable, with permanent magnets 1316 being affixed to or integrated within adjustable mid-plate 1315, and controllable magnets 1317, such as solenoid magnets, associated with an upper plate 1318 of coolant-cooled plate 1310. Bellows 1301 (or springs) may be provided around the portion of solenoid magnets 1317 extending into coolant-cooled cold plate 1310 to couple adjustable mid-plate 1315 to upper plate 1318. By controlling the magnetic force applied by controllable magnets 1317, including polarity of the magnets, the adjustable mid-plate 1315 can be moved to adjust the effective channel height 'H' of the plurality of parallel, coolant-carrying channels 1311. Hard stops 1314 may be provided, for example, at a desired minimum channel height 'H'.

Coolant flows into the parallel, coolant-carrying channels 1311 via one or more coolant inlets 1320, and egresses via one or more coolant outlets 1321. Note that the space 1319 between adjustable mid-plate 1315 and upper plate 1318 of the coolant-cooled cold plate may be filled with coolant, but that coolant flow is principally through coolant-carrying channels 1311.

Controller 1330 may be within the common electronic system containing the coolant-cooled cold plate 1310, or could be disposed within another electronic system within the same electronics rack, or even remote from the rack containing the coolant-cooled cold plate. The controller implements a control process for automatically controlling position of adjustable mid-plate 1315, and thus control (in this example) the coolant flow cross-section through the plurality of coolant-carrying channels, and therefore through the cold plate. The controller 1330 actively controls the physical configuration of the coolant-cooled cold plate, and this active control is to, for instance, optimally cool the associated electronic components being cooled by the cold plate, while at the same time reducing power consumption of the cooling apparatus. In one embodiment, the adjustable mid-plate is adjusted by the controller to reconfigure the effective channel height based on, for example, heat dissipated by the associated electronic component(s) being cooled and/or the coolant flow rate through the coolant-cooled cold plate, for example, in a manner similar to that described above in connection with FIG. 9.

The adjustable mid-plate 1315 may contain grooves or slots corresponding to each channel wall 1312 for movement of the plate normal to the parallel-extending, coolant-carrying channel lengths. As noted, polarity of the adjustable magnets 1317 associated with upper plate 1318 of the cold plate can be toggled, and magnetic strength can be varied, to attract or repel the adjustable mid-plate, as desired. Thus, by controlling the magnetic force between the adjustable mid-plate and the upper plate, the effective channel height can be adjusted and controlled. Polarity of the controllable magnets 1317 can be toggled based on the direction of electrical current through the windings of the solenoid magnets. The magnetic strength of the solenoid magnets may be controlled based on the magnitude of electrical current through the windings. The multiple bellows 1301 could alternatively comprise multiple springs. These structures facilitate coupling of the adjustable mid-plate to the upper plate.

Figure 13C:
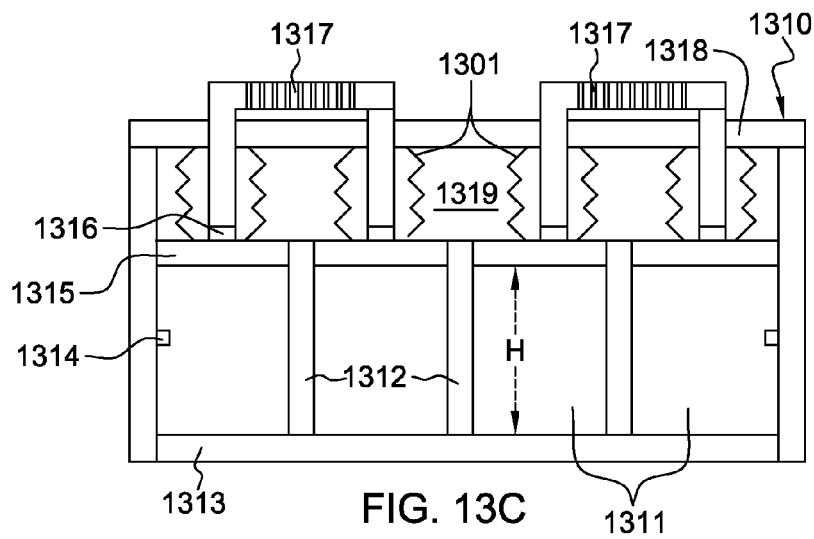
FIG. 13C is a cross-sectional elevational view of the coolant-cooled cold plate of FIGS. 13A & 13B, with the cold plate shown in a first stage, wherein the adjustable physical characteristic is configured to present a maximum available cross-sectional flow area through the cold plate, in accordance with one or more aspects of the present invention.
Figure 13D:
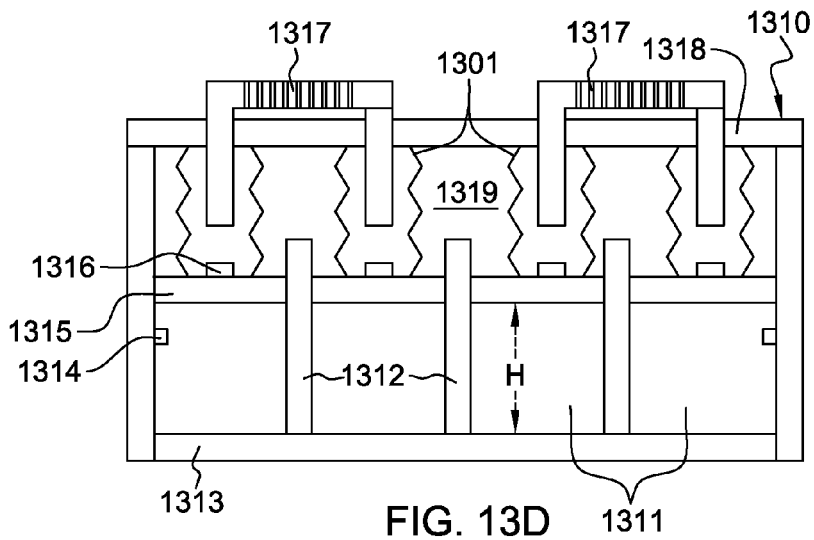
FIG. 13D is a cross-sectional elevational view of the coolant-cooled cold plate of FIGS. 13A-13C, with the cold plate shown in a second stage, wherein the adjustable physical characteristic is reconfigured to reduce the available cross-sectional flow area through the cold plate, in accordance with one or more aspects of the present invention.
Figure 13E:
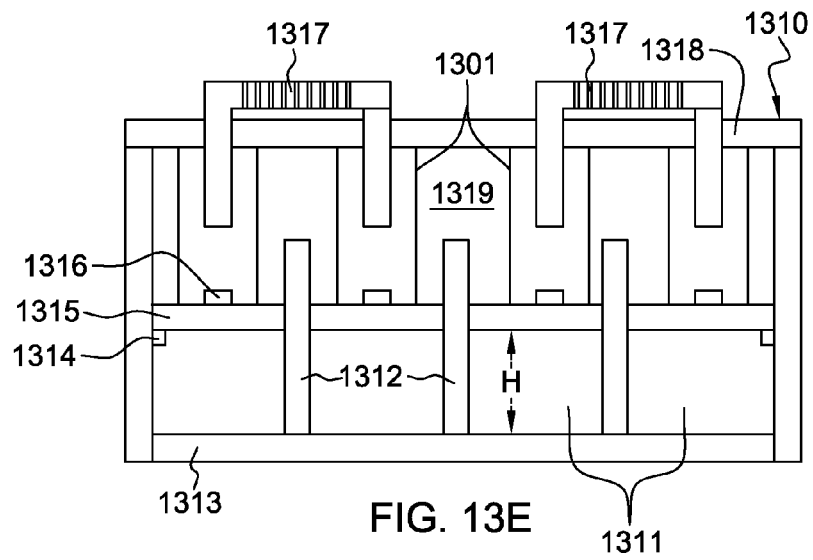
FIG. 13E is a cross-sectional elevational view of the coolant-cooled cold plate of FIGS. 13A-13D, with the cold plate shown in a third stage, wherein the adjustable physical characteristic is reconfigured to further reduce the available cross-sectional flow area through the cold plate, in accordance with one or more aspects of the present invention.

FIGS. 13C-13E depict three different stages (or positions) of the adjustable mid-plate 1315 relative to, for example, base plate 1313 of the coolant-cooled cold plate. At stage 1, illustrated in FIG. 13C, the magnetic components on upper plate 1318 have polarity opposite to that of the magnets on the adjustable mid-plate 1315, so that the plates attract each other and attach together. In this position, the height 'H' of the coolant-carrying channels is at a maximum, and the larger cross-sectional flow areas result in a relatively lower Reynolds Number for the same coolant mass flow rate, that is, compared with the positioning of the adjustable mid-plate in either stage 2 or stage 3 illustrated in FIGS. 13D & 13E, respectively.

As illustrated in FIG. 13D, at stage 2, the magnetic components of the upper plate 1318 could have similar polarity or partially similar and partially opposite polarity, to that of the movable mid-plate 1315. The magnetic strength of the magnetic components on the upper plate could be varied as well so that the adjustable mid-plate stays at an intermediate position, such as illustrated in the figure. At stage 3, illustrated in FIG. 13E, the magnetic components on the upper plate have similar polarity as that on the adjustable mid-plate, so that the plates repel each other and, in this example, the mid-plate rests on hard stops 1314 of the coolant-cooled cold plate. The magnetic strength of the magnetic components on the upper plate may be adjusted so that the adjustable mid-plate is farthest from the top plate, resulting in the smallest possible effective channel height 'H'.

Note that, at stage 1, the channels are the highest, resulting in a large cross-sectional area for coolant flow, while at stage 3, the channels have the smallest height, resulting in a smaller cross-sectional area for coolant flow. Thus, for a given mass flow rate, the Reynolds Number for the coolant flow is highest in stage 3. At stage 2, the channel height is relatively smaller as compared to stage 1, resulting in a relatively smaller cross-sectional flow rate. Thus, for a given mass flow rate, the Reynolds Number for the coolant flow is relatively higher in stage 2 than for stage 1. For a given mass flow rate through the cold plate, stage 3 offers the highest heat transfer rate. It should be noted that the convective heat transfer rates are higher for larger Reynolds Number flows.

Figure 14A:
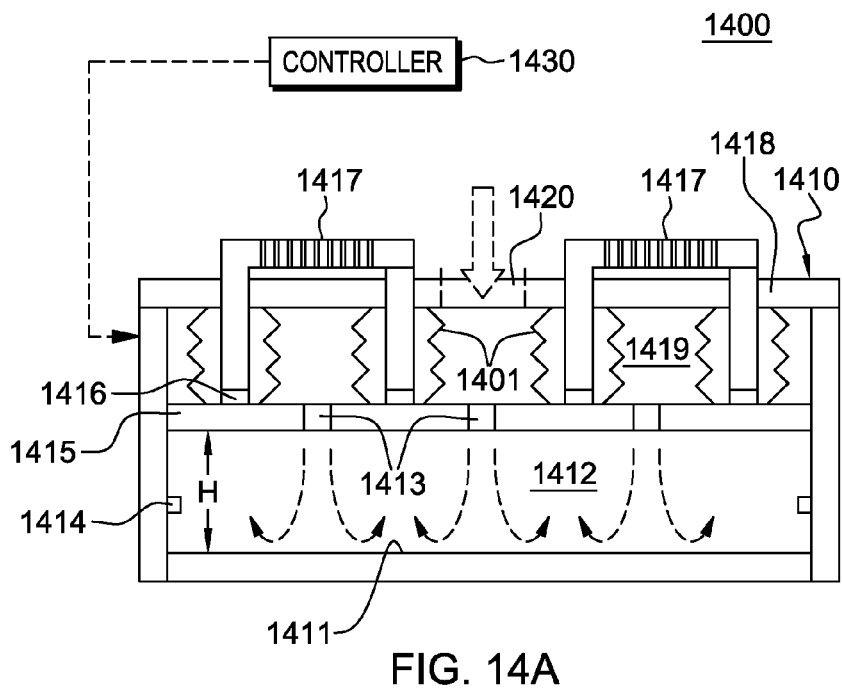
FIG. 14A depicts a further embodiment of a cooling apparatus comprising a coolant-cooled cold plate with an adjustable physical characteristic, wherein the cold plate comprises an adjustable jet orifice plate, in accordance with one or more aspects of the present invention.
Figure 14B:
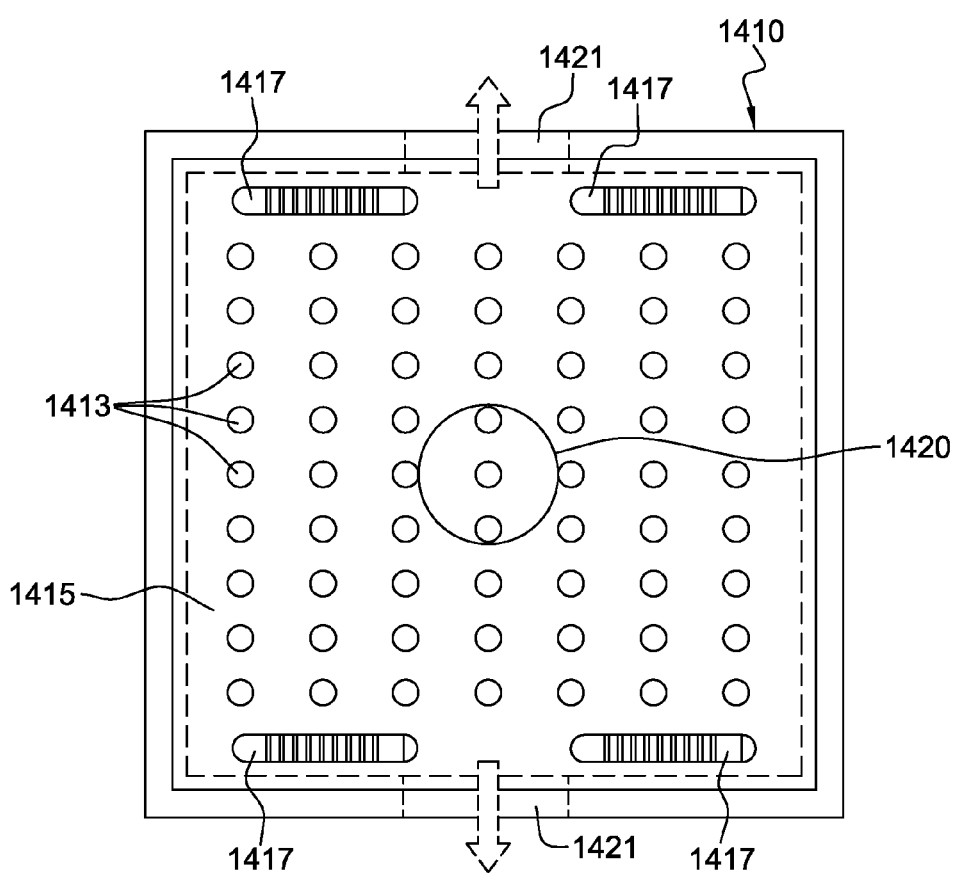
FIG. 14B is a plan view of the coolant-cooled cold plate of FIG. 14A, in accordance with one or more aspects of the present invention.

FIGS. 14A & 14B depict a further embodiment of a cooling apparatus 1400, in accordance with one or more aspects of the present invention. Cooling apparatus 1400 includes a coolant-cooled cold plate 1410 and a controller 1430 for actively controlling a physical configuration of the coolant-cooled cold plate. In this implementation, the coolant-cooled cold plate 1410 includes an adjustable jet orifice plate 1415 with a plurality of orifices 1413. A height 'H' of adjustable jet orifice plate 1415 is adjustable by controller 1430 to adjust the impingement height of the jet flows from jet orifices 1413 onto a target surface 1411, for example, of coolant-cooled cold plate 1410. In one embodiment, coolant-cooled cold plate 1410 sets on top of one or more electronic components to be cooled. The orifices 1413 in adjustable jet orifice plate 1415 may be arrayed in a regular pattern, as illustrated in FIG. 14B, or alternatively, may be irregularly-spaced depending, for example, on the location of the underlying one or more heat-generating electronic components being cooled by the cold plate.

In the depicted embodiment, the adjustable jet orifice plate 1415 is magnetically adjustable, and comprises permanent magnets 1416 affixed to or integrated with the adjustable jet orifice plate. Controllable magnets 1417, such as solenoid magnets, are associated with upper plate 1418 of coolant-cooled cold plate 1410. By controlling the magnetic force applied by the controllable magnets 1417, including polarity of the magnets, the adjustable jet orifice plate 1415 can be moved to adjust the effective impingement height 'H' of the jet orifice plate relative to target surface 1411. In this implementation, the adjustable impingement height is a physical characteristic of the coolant-cooled cold plate that is changeable by control of the magnetic force being applied to the adjustable jet orifice plate 1415. Hard stops 1414 are provided, for example, at a desired minimum jet impingement height 'H'.

Coolant flows into the coolant-cooled cold plate via one or more coolant inlets 1420, and after impinging on the target surface 1411, egresses via one or more coolant outlets 1421. Note that space 1419 between the adjustable jet orifice plate 1415 and upper plate 1418 operates as a coolant supply plenum in this example, and that adjustable bellows 1401 are provided around the magnet portions of magnets 1416, 1417 within the space 1419 to, for example, couple the adjustable jet orifice plate to the upper plate. The adjustable jet orifice plate could be attached to the upper plate 1480 via either the multiple bellows 1401, or alternatively, multiple springs. Further, the controllable magnetic components 1417 on the upper plate could be solenoid magnets whose polarity could be toggled based on the direction of electrical current through the windings. Also, the magnetic strength of the solenoid magnets could be controlled based on the magnitude of electrical current through the windings.

Controller 1430 may be within a common electronic system containing the coolant-cold plate 1410, or could be disposed in another electronic system within the same electronics rack, or even remote from the electronics rack containing the coolant-cooled cold plate. The controller implements a control process for automatically controlling position of the adjustable jet orifice plate 1415, and thus controlling the impingement height of the jet flow directed towards the target surface 1411 being cooled. Thus, the controller 1430 actively controls a configuration and a physical characteristic of the coolant-cooled cold plate, and this active control is to, for instance, optimally cool the associated electronic components being cooled by the cold plate, while at the same time, reduce cooling power consumption. In one embodiment, the adjustable jet orifice plate is adjusted by the control to reconfigure the effective jet impingement height based on, for example, heat dissipated by the associated electronic component(s) being cooled, and/or the coolant flow rate through the coolant-cooled cold plate.

Figure 14C:
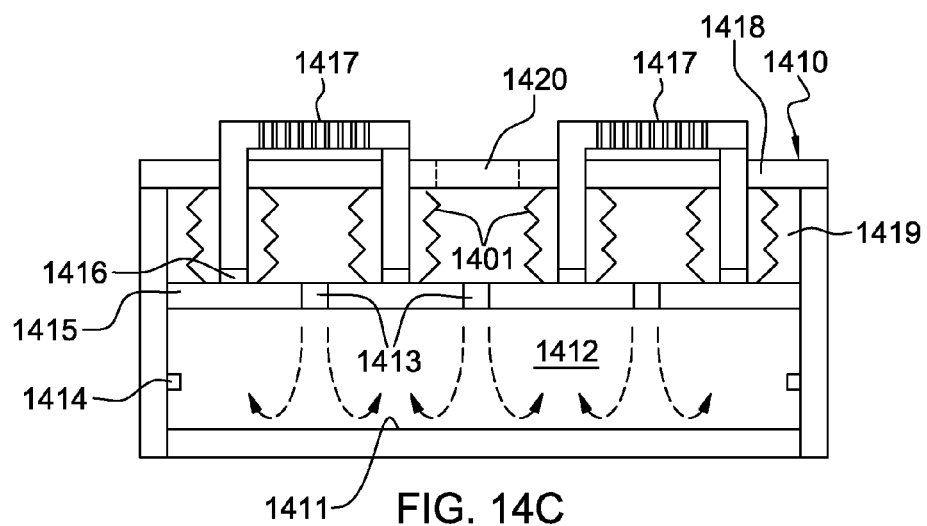
FIG. 14C is a cross-sectional elevational view of the coolant-cooled cold plate of FIGS. 14A & 14B, with the jet orifice plate shown in a first stage, where jet impingement height is highest, in accordance with one or more aspects of the present invention.
Figure 14D:
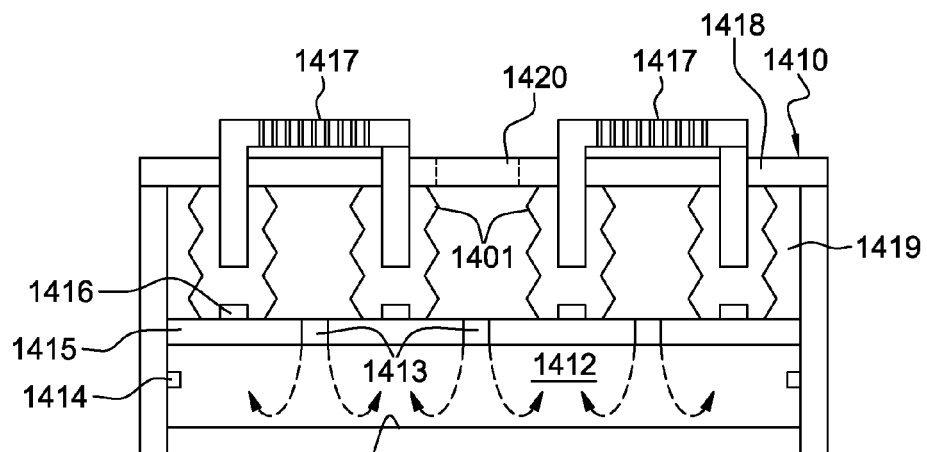
FIG. 14D is a cross-sectional elevational view of the coolant-cooled cold plate of FIGS. 14A-14C, with the jet orifice plate shown in a second stage, wherein jet impingement height is reduced from the first stage, in accordance with one or more aspects of the present invention.
Figure 14E:
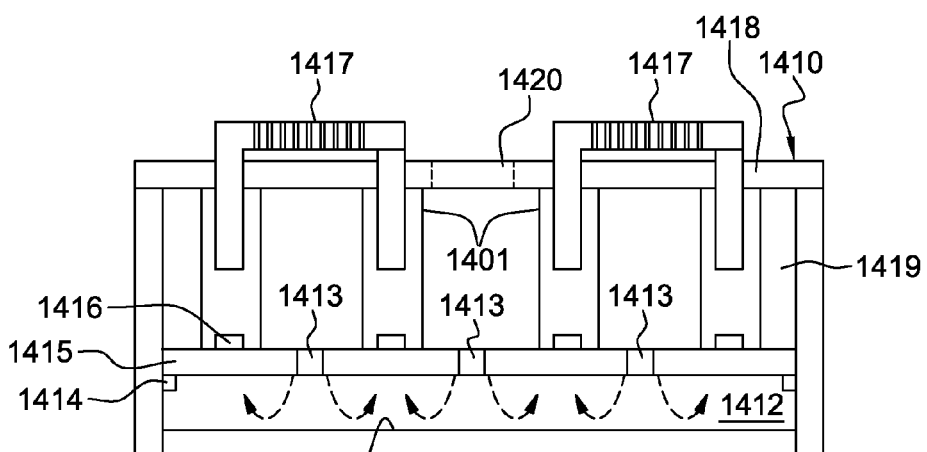
FIG. 14E is a cross-sectional elevational view of the coolant-cooled cold plate of FIGS. 14A-14E, with the jet orifice plate shown in a third stage, wherein jet impingement height is reduced from the second stage, in accordance with one or more aspects of the present invention.

FIGS. 14C-14E depict three different stages of the adjustable jet orifice plate 1415 within the coolant-cooled cold plate 1410 of FIGS. 14A & 14B. Processing for controlling the position of the adjustable plate between these three stages may be similar to that described above in connection with FIG. 9. At stage 1, illustrated in FIG. 14C, the magnetic components on the upper plate have polarity opposite to that of the permanent magnets on the adjustable jet orifice plate 1415, so that the adjustable plate is attracted to the upper plate, and the two plates attach, as illustrated. Depending on the flow rate, this positioning could provide optimum impingement height and/or separation. At stage 2, illustrated in FIG. 14D, the magnetic components on upper plate 1418 may have similar polarity, or partially similar and partially opposite polarity, as the polarity of the permanent magnets on the adjustable orifice plate 1415. The magnetic strength of magnetic components 1417 on upper plate 1418 may be varied as well, so that the moveable plate 1415 stays at an intermediate position, such as illustrated in FIG. 14D. At stage 3, illustrated in FIG. 14E, the magnetic components 1417 on upper plate 1418 have similar polarity to the permanent magnets on adjustable jet orifice plate 1415, such that the plates repel each other. The magnetic strength of the magnetic components 1417 on upper plate 1418 can be adjusted so that the adjustable jet orifice plate 1415 is farthest from the upper plate, resulting in a smallest effective impingement height 'H'. Depending on the flow rate, any one of the three stages could provide the optimum impingement height/separation in order to optimize cooling performance of the cold plate.

Figure 15A:
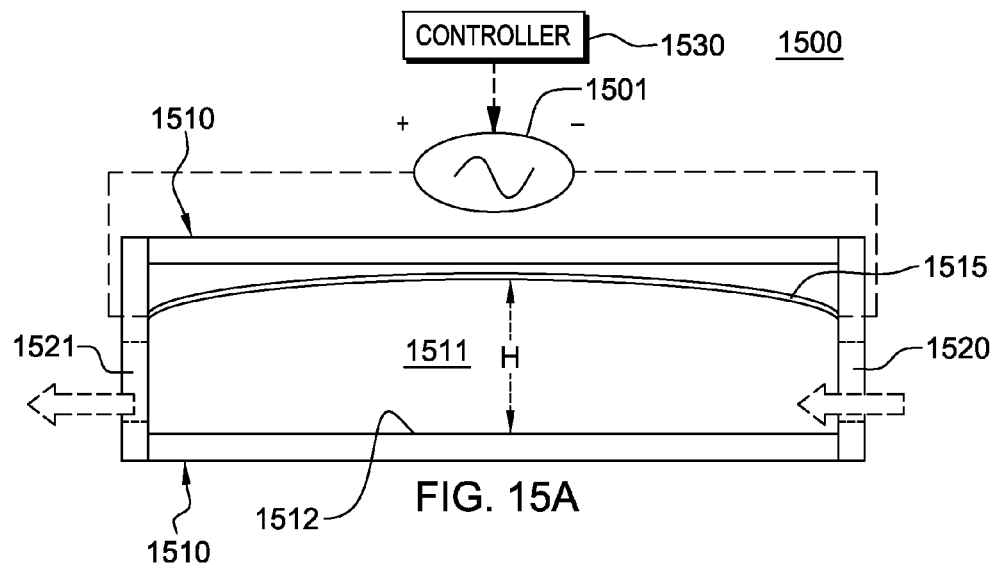
FIG. 15A depicts another embodiment of a cooling apparatus comprising a coolant-cooled cold plate with a physical configuration controlled by an adjustable piezoelectric mid-plate, the mid-plate being shown deflected away from the channel base to increase available cross-section flow area through the cold plate, in accordance with one or more aspects of the present invention.
Figure 15B:
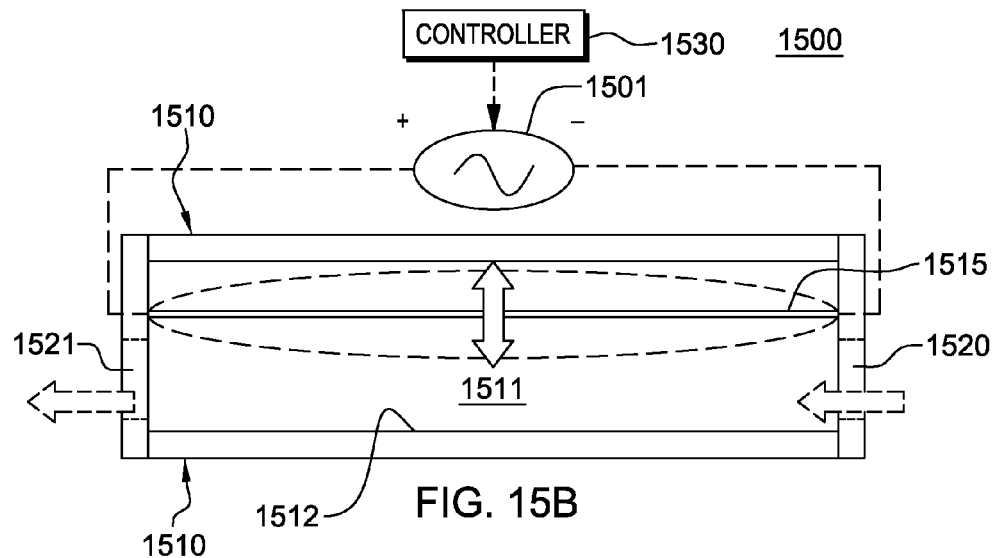
FIG. 15B is a cross-sectional elevational view of the coolant-cooled cold plate of FIG. 15A, with the adjustable piezoelectric mid-plate undeflected, in accordance with one or more aspects of the present invention.
Figure 15C:
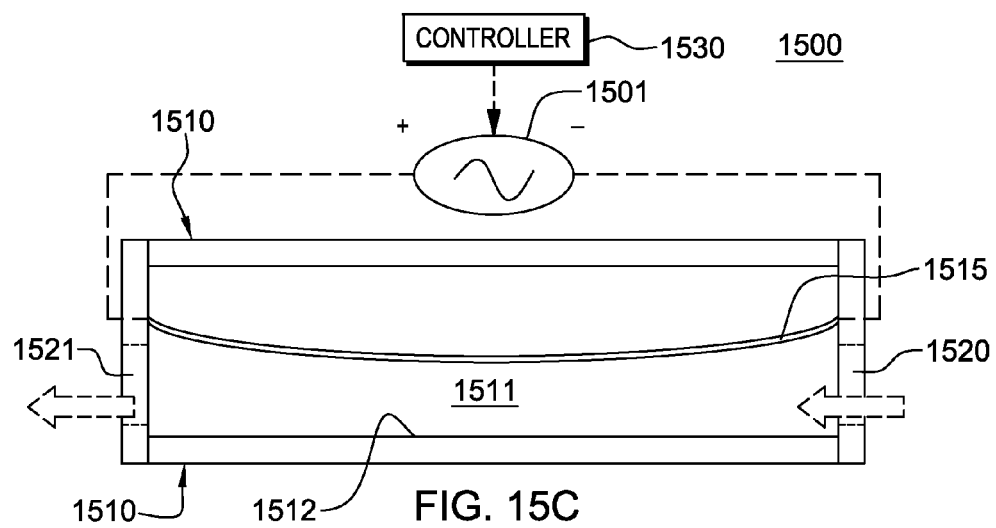
FIG. 15C is a cross-sectional elevational view of the coolant-cooled cold plate of FIGS. 15A & 15B, with the adjustable piezoelectric mid-plate deflected towards the channel base to present a smaller available cross-sectional flow area through the cold plate, in accordance with one or more aspects of the present invention.

FIGS. 15A-15C depict a further embodiment of a cooling apparatus, generally denoted 1500, in accordance with one or more aspects of the present invention. Cooling apparatus 1500 includes a coolant-cooled cold plate 1510 and a controller 1530 for actively controlling a physical configuration, and thus a physical characteristic, of the coolant-cooled cold plate. The coolant-cooled cold plate 1510 includes, in this embodiment, one or more coolant-carrying channels 1511 defined between a base plate 1512 and an adjustable plate 1515. In one example, adjustable plate 1515 is a piezoelectric plate, which may be adjusted to adjust the effective channel height between the adjustable plate and base plate 1512 of the cold plate based, for example, on the heat dissipated by the electronic component(s) being cooled and/or the coolant flow rate through the cold plate. There may either be a single adjustable plate 1515 for the entire cold plate, or (for example) there may be an adjustable plate for each individual coolant-carrying channel 1511 of the cold plate. In the case of a single adjustable plate 1515 for the entire cold plate, the plate may contain grooves/slots corresponding to each channel wall (not shown) for movement of the adjustable plate normal to the length of the channels. The adjustable plate may be made out of a piezoelectric material, such that by controlling the direction and magnitude of electrical current through the plate, the plate could be bent to alter the effective channel height. Thus, the heat transfer rates near the center of the channels (or inside the channels, in general) can be increased or decreased to optimally cool the electronic component(s).

At stage 1, illustrated in FIG. 15A, a voltage/current is applied to the adjustable plate such that the plate deflects away from base plate 1512 of the coolant-carrying channel(s) 1511, resulting in a relatively larger cross-section for coolant flow. At stage 2, illustrated in FIG. 15B, no voltage/current is applied across the adjustable piezoelectric plate, and thus, the plate stays in a neutral position, resulting in a relatively smaller cross-sectional area for coolant flow. At stage 3, illustrated in FIG. 15C, a voltage/current is applied so that the plate deflects towards the base plate 1512, resulting in a relatively smaller cross-section for coolant flow. This also results in flow acceleration in the region between the cold plate inlet and channel center, resulting in increased heat transfer rates in that region. At stage 1, the channels are the tallest, resulting in a larger cross-section for coolant flow. Thus, for a given mass flow rate, the Reynolds Number for the flow in stage 1 (FIG. 15A) is the smallest of the three stages, while at stage 3, the channels are the smallest, resulting in a smaller cross-section for coolant flow. Thus, for a given mass flow rate, the Reynolds Number for the coolant flow is the highest at stage 3. At stage 2, the channel height is relatively smaller than stage 1, resulting in a relatively smaller cross-section for coolant flow, and for a given mass flow rate, a larger Reynolds Number, compared with stage 1. For a given mass flow rate through the cold plate, stage 3 offers the highest heat transfer rates. It should be noted that the convective heat transfer rates are higher for higher Reynolds Number flows.

Implementation of the cooling apparatuses and cooling methods described above may require replacement of various hardware components, or use of additional hardware components, within an electronics rack. Once the required hardware is installed, controls associated with each cold plate could be implemented in a number of ways. One way is to program the control process onto a programmable logic controller (PLC) unit of the data center facility. Another way is to implement the control processing on a remote computer/server which takes in the required input information from the data center components and outputs the optimum operational points for the various coolant-cooled cold plates within the system. Another approach to implementing the control depends on where the components are installed. For instance, if the components are located inside of each server in a multi-server rack, then the control could be programmed into that server's management controller, such as the baseboard management controller (BMC), intelligent platform management interface (IPMI), etc.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 16:
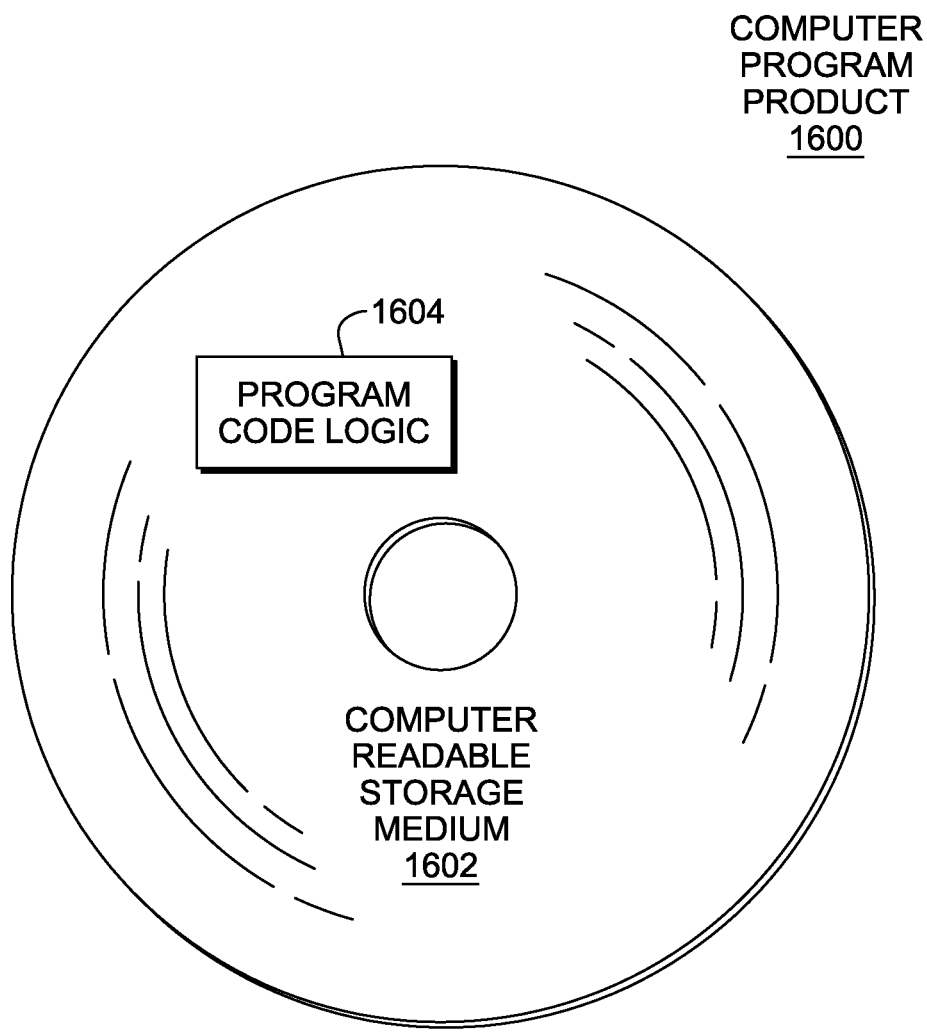
FIG. 16 depicts one embodiment of a computer program product incorporating one or more aspects of the present invention, in accordance with one or more aspects of the present invention.

Referring now to FIG. 16, in one example, a computer program product 1600 includes, for instance, one or more non-transitory computer readable storage media 1602 to store computer readable program code means or logic 1604 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
   a coolant-cooled cold plate configured to couple to at least one electronic component to be cooled, the coolant-cooled cold plate comprising at least one coolant-carrying channel internal to the coolant-cooled cold plate and at least one internal plate within the coolant-cooled cold plate; and
   a controller configured to dynamically vary an internal physical configuration of the coolant-cooled cold plate based on a monitored variable associated with at least one of the coolant-cooled cold plate or the at least one electronic component to be cooled by the coolant-cooled cold plate, wherein the dynamically varying the internal physical configuration comprises changing location of the at least one internal plate within the coolant-cooled cold plate to dynamically reconfigure the at least one coolant-carrying channel within the coolant-cooled cold plate and thereby alter at least one of thermal or fluid dynamic performance of the coolant-cooled cold plate cooling the electronic component.

2. The cooling apparatus of claim 1, wherein the controller dynamically varying comprises repositioning the at least one internal plate within the coolant-cooled cold plate to change a coolant flow cross-section through the coolant-cooled cold plate based on the monitored variable.

3. The cooling apparatus of claim 2, wherein the dynamically varying by the controller comprises switching position of the at least one internal plate to adjust the internal physical configuration of the coolant-cooled cold plate among multiple predefined configuration stages based on the monitored variable.

4. The cooling apparatus of claim 2, wherein the varying, by the controller, the internal physical configuration varies a height of the at least one coolant-carrying channel of the coolant-cooled cold plate.

5. The cooling apparatus of claim 4, wherein the at least one internal plate of the coolant-cooled cold plate comprises an adjustable mid-plate, wherein adjustment of the adjustable mid-plate varies the height of the at least one coolant-carrying channel of the coolant-cooled cold plate.

6. The cooling apparatus of claim 5, wherein the adjustable mid-plate is magnetically adjustable, and wherein the dynamically varying the internal physical configuration comprises magnetically, actively controlling the position of the mid-plate within the coolant-cooled cold plate to control the height of the at least one coolant-carrying channel of the coolant-cooled cold plate.

7. The cooling apparatus of claim 6, wherein the adjustable mid-plate comprises a plurality of permanent magnets coupled thereto.

8. The cooling apparatus of claim 6, wherein the dynamically varying comprises actively controlling a magnetic force applied to the mid-plate to control positioning of the adjustable mid-plate within the coolant-cooled cold plate.

9. The cooling apparatus of claim 6, further comprising a plurality of solenoid-based magnets associated with the coolant-cooled cold plate, and wherein the dynamically varying comprises actively controlling a magnetic force applied to the adjustable mid-plate to control positioning of the adjustable mid-plate within the coolant-cooled cold plate.

10. The cooling apparatus of claim 1, wherein the coolant-cooled cold plate comprises a plurality of coolant-carrying channels extending at least partially in parallel, the at least one coolant-carrying channel being at least one coolant-carrying channel of the plurality of coolant-carrying channels, and wherein the dynamically varying the internal physical configuration of the coolant-cooled cold plate comprises repositioning the at least one internal plate within the coolant-cooled cold plate to dynamically reconfigure the plurality of coolant-carrying channels of the coolant-cooled cold plate.

11. The cooling apparatus of claim 10, wherein the dynamically varying, by the controller, comprises dynamically reconfiguring which coolant-carrying channels of the plurality of parallel, coolant-carrying channels within the coolant-cooled cold plate have coolant flowing therethrough.

12. The cooling apparatus of claim 10, wherein the at least one internal plate comprises at least one isolation plate, and dynamically varying, by the controller, comprises actively adjusting positioning of the at least one isolation plate within the coolant-cooled cold plate to selectively isolate one or more coolant-carrying channels of the plurality of coolant-carrying channels from coolant flowing through the coolant-cooled cold plate.

13. The cooling apparatus of claim 12, wherein the dynamically varying, by the controller, comprises dynamically controlling positioning of the at least one isolation plate between multiple defined plate position stages to selectively alter the at least one thermal or fluid dynamic performance of the coolant-cooled cold plate based on the monitored variable.

14. The cooling apparatus of claim 1, wherein the at least one internal plate comprises a piezoelectric plate associated with the at least one coolant-carrying channel, and wherein the dynamically varying, by the controller, comprises actively controlling the piezoelectric plate to dynamically reconfigure a coolant flow cross-section through the at least one coolant-carrying channel, and thereby alter the at least one of thermal or fluid dynamic performance of the coolant-carrying cold plate.

15. The cooling apparatus of claim 1, wherein the at least one internal plate of the coolant-cooled cold plate comprises an adjustable jet orifice plate with a plurality of jet orifices therein, and wherein the dynamically varying, by the controller, comprises actively controlling an effective impingement height between the adjustable jet orifice plate and a target surface, wherein varying the internal physical configuration varies a physical characteristic of the coolant-cooled cold plate, the internal physical characteristic comprising a height of the adjustable jet orifice plate relative to the target surface.

16. A computer program product comprising:
a non-transitory computer-readable storage medium comprising computer program code embodied therewith, the computer program code executable by a processing circuit to facilitate performing a method comprising:
monitoring a variable associated with at least one of a coolant-cooled cold plate or an electronic component being cooled by the coolant-cooled cold plate, the coolant-cooled cold plate comprising at least one coolant-carrying channel internal to the coolant-cooled cold plate and at least one internal plate within the coolant-cooled cold plate; and
initiating dynamic varying, based on the monitored variable, of an internal physical configuration of the coolant-cooled cold plate, the initiating dynamically varying comprising initiating dynamically reconfiguring the internal physical configuration of the coolant-cooled cold plate by automatically adjusting location of the at least one internal plate within the coolant-cooled cold plate, wherein the dynamically varying the internal physical configuration alters at least one of thermal or fluid dynamic performance of the coolant-cooled cold plate cooling the electronic component by changing a coolant flow cross-section through the at least one coolant-carrying channel within the coolant-cooled cold plate.

17. The computer program product of claim 16, wherein the dynamically varying comprises switching position of the at least one internal plate to adjust the internal physical configuration of the coolant-cooled cold plate among multiple predefined configuration stages based on the monitored variable.

18. The computer program product of claim 16, wherein the coolant-cooled cold plate comprises a plurality of coolant-carrying channels extending at least partially in parallel, the at least one coolant-carrying channel being at least one coolant-carrying channel of the plurality of coolant-carrying channels and wherein the dynamically varying the internal physical configuration of the coolant-cooled cold plate comprises repositioning the at least one internal plate within the coolant-cooled cold plate to dynamically reconfigure the plurality of coolant-carrying channels of the coolant-cooled cold plate.

19. The computer program product of claim 16, wherein the at least one internal plate of the coolant-cooled cold plate comprises an adjustable jet orifice plate with a plurality of jet orifices therein, and wherein the dynamically varying comprises actively controlling an effective impingement height between the adjustable jet orifice plate and a target surface, wherein varying the internal physical configuration varies a physical characteristic of the coolant-cooled cold plate, the internal physical characteristic comprising a height of the adjustable jet orifice plate relative to the target surface.

* * * * *